US012763120B2

(12) United States Patent
Uchida

(10) Patent No.: US 12,763,120 B2
(45) Date of Patent: Oct. 13, 2026

(54) STORAGE DEVICE, ELECTRONIC APPARATUS, AND METHOD FOR MANUFACTURING STORAGE DEVICE

(71) Applicant: SONY SEMICONDUCTOR SOLUTIONS CORPORATION, Kanagawa (JP)

(72) Inventor: Hiroyuki Uchida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 210 days.

(21) Appl. No.: 18/839,189

(22) PCT Filed: Feb. 20, 2023

(86) PCT No.: PCT/JP2023/006011
§ 371 (c)(1),
(2) Date: Aug. 16, 2024

(87) PCT Pub. No.: WO2023/162927
PCT Pub. Date: Aug. 31, 2023

(65) Prior Publication Data
US 2025/0166683 A1 May 22, 2025

(30) Foreign Application Priority Data
Feb. 28, 2022 (JP) ................................. 2022-029754

(51) Int. Cl.
*G11C 11/15* (2006.01)
*G11C 11/16* (2006.01)
(Continued)

(52) U.S. Cl.
CPC ............ *G11C 11/161* (2013.01); *H10B 61/22* (2023.02); *H10N 50/10* (2023.02); *H10N 50/80* (2023.02);
(Continued)

(58) Field of Classification Search
CPC ...................................................... G11C 11/15
See application file for complete search history.

(56) References Cited

U.S. PATENT DOCUMENTS 6,707,710 B1 3/2004 Holden
2024/0381632 A1* 11/2024 Lin ........................ H10B 41/49

FOREIGN PATENT DOCUMENTS

JP 2007-157979 A 6/2007
JP 2009-004440 A 1/2009
(Continued)

OTHER PUBLICATIONS

International Search Report and Written Opinion of PCT Application No. PCT/JP2023/006011, issued on May 16, 2023, 13 pages of ISRWO.
(Continued)

*Primary Examiner* — Hoai V Ho
(74) *Attorney, Agent, or Firm* — CHIP LAW GROUP

(57) ABSTRACT

A storage device (1) according to an aspect of the present disclosure includes: a storage element and a reference element each having a fixed layer whose magnetization direction is fixed, a storage layer whose magnetization direction is changeable, and an insulating layer provided between the fixed layer and the storage layer; a base layer (for example, a lower insulating layer 32) provided with the storage element and the reference element; and a semiconductor substrate (200) having a surface (200*a*) on which the base layer is laminated, in which the base layer has a first inclined surface (M2) inclined with respect to the surface (200*a*), and a second inclined surface inclined with respect to a plane (M1) parallel to the surface (200*a*) or the surface (200*a*) at an inclination angle smaller than an inclination angle of the first inclined surface (M2), the storage element is provided
(Continued)

on the first inclined surface (M2), and the reference element is provided on the plane (M1) or the second inclined surface.

15 Claims, 11 Drawing Sheets

(51) Int. Cl.
*H10B 61/00* (2023.01)
*H10N 50/10* (2023.01)
*H10N 50/80* (2023.01)

(52) U.S. Cl.
CPC ....... *G11C 11/1673* (2013.01); *G11C 11/1675* (2013.01)

(56) References Cited

FOREIGN PATENT DOCUMENTS

| | | | |
|---|---|---|---|
| JP | 2009-020092 | A | 1/2009 |
| JP | 2009-105225 | A | 5/2009 |
| JP | 2018-026525 | A | 2/2018 |
| WO | 2021/176656 | A1 | 9/2021 |

OTHER PUBLICATIONS

S, Mangin, et al."Nature materials", vol. 5, Mar. 2006, p. 210.

* cited by examiner

STORAGE DEVICE, ELECTRONIC APPARATUS, AND METHOD FOR MANUFACTURING STORAGE DEVICE

CROSS REFERENCE TO RELATED APPLICATIONS

This application is a U.S. National Phase of International Patent Application No. PCT/JP2023/006011 filed on Feb. 20, 2023, which claims priority benefit of Japanese Patent Application No. JP 2022-029754 filed in the Japan Patent Office on Feb. 28, 2022. Each of the above-referenced applications is hereby incorporated herein by reference in its entirety.

FIELD

The present disclosure relates to a storage device, an electronic apparatus, and a method for manufacturing a storage device.

BACKGROUND

Along with the rapid development of various information apparatuses from large-capacity servers to mobile terminals, there has been a demand for further improvement in performance such as higher integration, higher speed, and lower power consumption in constituent elements thereof such as memories and logics. In particular, advancement of non-volatile semiconductor memories is remarkable, and for example, a flash memory as a large-capacity file memory has been widely spread at a speed of expelling a hard disk drive. On the other hand, considering the use for code storage and application to working memories, various types of semiconductor memories, such as a ferroelectric random access memory (FeRAM), a magnetic random access memory (MRAM), and a phase-change random access memory (PCRAM), have been developed in order to replace general NOR flash memory, dynamic random access memory (DRAM), and the like which are currently used. Note that some of them have already been put to practical use.

The MRAM, which is one of the above-described memories, stores information by utilizing a change of electrical resistance caused by changing a magnetization state (reversing a magnetization direction) of a magnetic substance of a magnetic storage element included in the MRAM. Therefore, the stored information can be read by determining a resistance state of the magnetic storage element set by the change in the magnetization state, specifically, a magnitude of the electrical resistance of the magnetic storage element. Such an MRAM is capable of high-speed operation, can be rewritten almost infinitely ($10^{15}$ times or more), and has high reliability, and thus, is already used in fields such as industrial automation and aircraft. In addition, the MRAM is expected to be extended to the code storage and the working memories in the future because of its high-speed operation and high reliability.

Among the MRAMs as described above, an MRAM that reverses magnetization of a magnetic substance using spin torque magnetization reversal has the above-described advantages such as the high-speed operation, and can also achieve low power consumption and large capacity, and thus, has greater expectations. Note that such an MRAM using the spin torque magnetization reversal is called a spin transfer torque-magnetic random access memory (STT-MRAM). The STT-MRAM includes, as a magnetic storage element, a magnetic tunnel junction (MTJ) element having two magnetic layers (storage layer and fixed layer) and an insulating layer (for example, MgO) sandwiched between the magnetic layers. Note that the MTJ element is also referred to as a tunneling magneto resistive (TMR) element.

In such a memory array of the STT-MRAM, there are a memory cell for recording information and a reference cell for High/Low (H/L) determination of a resistance value of the recorded information (see, for example, Patent Literature 1). The memory cell includes an MTJ element as a magnetic storage element (storage element). Further, the reference cell includes an MTJ element as a reference element for generating a reference resistance value.

CITATION LIST

Patent Literature

Patent Literature 1: JP 2009-4440 A

Non Patent Literature

Non Patent Literature 1: S. Mangin et al. Nature materials, vol. 5 March 2006, p. 210

SUMMARY

Technical Problem

However, in consideration of the operation of the reference cell, for example, the reference cell is made common to a plurality of the memory cells so that the number of accesses to the reference cell increases at the time of reading information. Thus, erroneous writing (read disturb) in which writing is performed at the time of reading sometimes occurs.

Therefore, the present disclosure provides a storage device, an electronic apparatus, and a method for manufacturing a storage device capable of suppressing occurrence of erroneous writing.

Solution to Problem

A storage device according to an aspect of the present disclosure includes: a storage element and a reference element each having a fixed layer whose magnetization direction is fixed, a storage layer whose magnetization direction is changeable, and an insulating layer provided between the fixed layer and the storage layer; a base layer provided with the storage element and the reference element; and a semiconductor substrate having a surface on which the base layer is laminated, wherein the base layer has a first inclined surface inclined with respect to the surface, and a second inclined surface inclined with respect to the surface or a plane parallel to the surface at an inclination angle smaller than an inclination angle of the first inclined surface, the storage element is provided on the first inclined surface, and the reference element is provided on the plane or the second inclined surface.

An electronic apparatus according to an aspect of the present disclosure includes a storage device that stores information, wherein the storage device includes: a storage element and a reference element each having a fixed layer whose magnetization direction is fixed, a storage layer whose magnetization direction is changeable, and an insulating layer provided between the fixed layer and the storage layer; a base layer provided with the storage element and the reference element; and a semiconductor substrate having a surface on which the base layer is laminated, the base layer has: a first inclined surface inclined with respect to the surface; and a second inclined surface inclined with respect to the surface or a plane parallel to the surface at an inclination angle smaller than an inclination angle of the first inclined surface, the storage element is provided on the first inclined surface, and the reference element is provided on the plane or the second inclined surface.

A method for manufacturing a storage device according to an aspect of the present disclosure, the method includes: forming, on a surface of a semiconductor substrate, a base layer having a first inclined surface inclined with respect to the surface and a second inclined surface inclined with respect to the surface or a plane parallel to the surface at an inclination angle smaller than an inclination angle of the first inclined surface; and forming, on the first inclined surface, a storage element having a fixed layer whose magnetization direction is fixed, a storage layer whose magnetization direction is changeable, and an insulating layer provided between the fixed layer and the storage layer, and forming, on the plane or the second inclined surface, a reference element having a fixed layer whose magnetization direction is fixed, a storage layer whose magnetization direction is changeable, and an insulating layer provided between the fixed layer and the storage layer.

DESCRIPTION OF EMBODIMENTS

Figure 1:
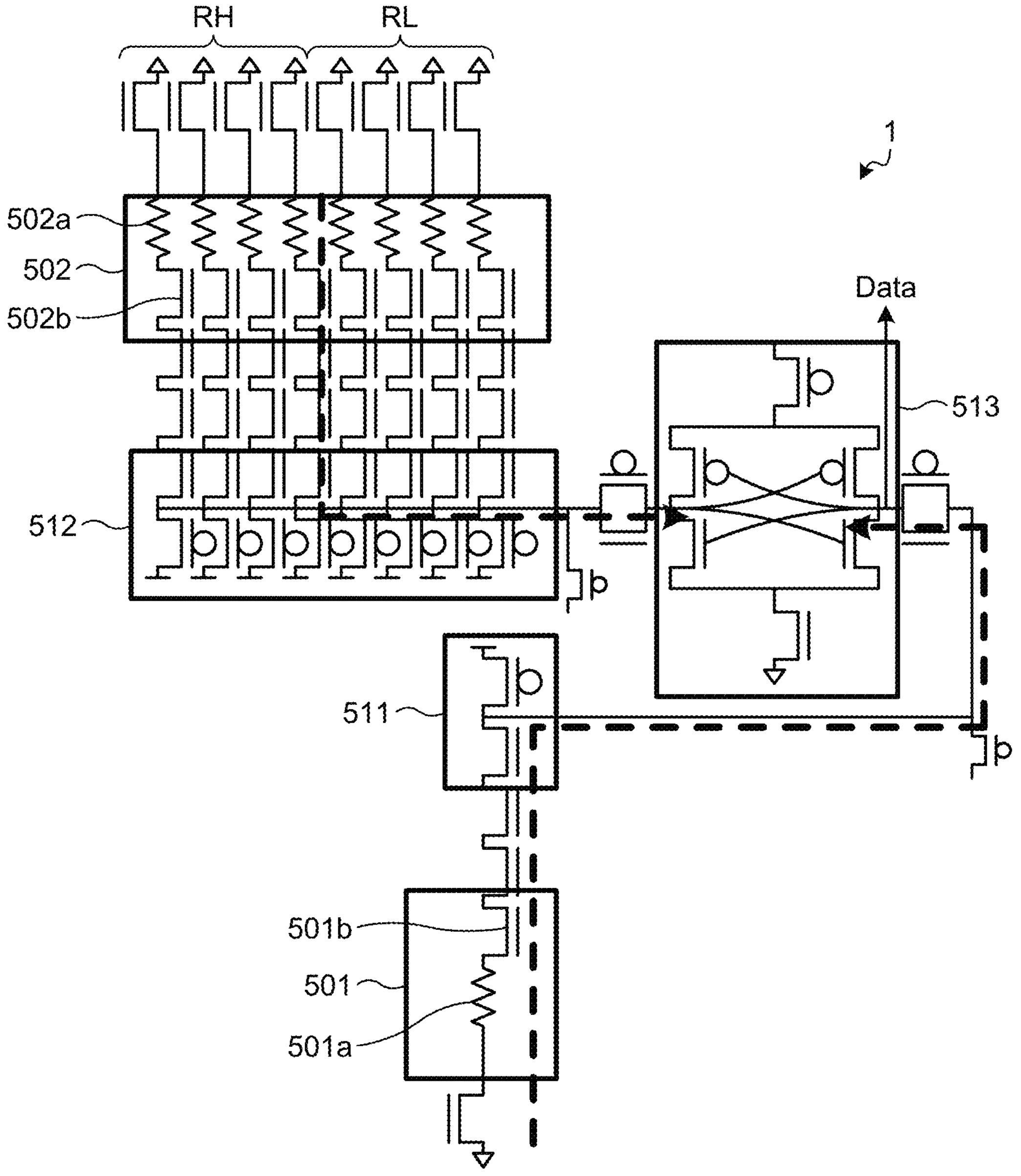
FIG. 1 is a diagram illustrating an example of a schematic configuration of a storage device according to a first embodiment.

Hereinafter, embodiments of the present disclosure will be described in detail with reference to the drawings. Note that a device, an apparatus, a method, and the like according to the present disclosure are not limited by the embodiments. Further, the same portions are basically denoted by the same reference signs in each of the following embodiments, and a repetitive description thereof will be omitted.

One or a plurality of embodiments (including examples and modifications) to be described hereinafter can be implemented independently. Meanwhile, at least some of the plurality of embodiments to be described hereinafter may be implemented appropriately in combination with at least some of other embodiments. The plurality of embodiments may include novel features different from each other. Therefore, the plurality of embodiments can contribute to achieving mutually different objects or solutions to problems, and can exhibit mutually different effects. Note that the effects of the respective embodiments are merely examples and are not limited, and additional effects may be present.

Further, the drawings referred to in the following description are drawings for facilitating the description and understanding of an embodiment of the present disclosure, and shapes, dimensions, ratios, and the like illustrated in the drawings are sometimes different from actual ones for the sake of clarity. Furthermore, an element and the like illustrated in the drawings can be appropriately modified in design in consideration of the following description and known techniques. Further, in the following description, a vertical direction of a laminate structure of the element and the like corresponds to a relative direction in a case where a surface of a substrate on which the element is provided is facing upward, and is sometimes different from the vertical direction according to actual gravitational acceleration.

Further, in the following description, terms such as "perpendicular direction" (a direction perpendicular to a film surface or a laminating direction of the laminate structure) and "in-plane direction" (a direction parallel to the film surface or a direction perpendicular to the laminating direction of the laminate structure) are used for convenience when the description regarding a magnetization direction (magnetic moment) or magnetic anisotropy is given. However, these terms do not necessarily mean the exact directions of magnetization. For example, an expression such as "the magnetization direction is the perpendicular direction" or "having perpendicular magnetic anisotropy" means a state where magnetization in the perpendicular direction is superior to magnetization in the in-plane direction. Similarly, for example, an expression such as "the magnetization direction is the in-plane direction" or "having in-plane magnetic anisotropy" means a state where magnetization in the in-plane direction is superior to magnetization in the perpendicular direction.

The present disclosure will be described in the following item order.

1. First Embodiment
1-1. Configuration Example of Storage Device
1-2. Configuration Example of Cell Structure of Storage Device
1-3. Configuration Example of MTJ Element
1-4. Writing and Reading of MTJ Element
1-5. In-Plane Magnetization STT-MRAM and Perpendicular Magnetization STT-MRAM
1-6. Method for Manufacturing MTJ Element
1-7. First Modification of Base
1-8. Second Modification of Base
1-9. Method for Forming Inclined Surface of Base
1-10. Action and Effect
2. Second Embodiment
2-1. Method for Manufacturing MTJ Element
2-2. Action and Effect
3. Other Embodiments
4. Configuration Example of Electronic Apparatus
4-1. Imaging Device
4-2. Game Apparatus
5. Appendix

1. First Embodiment

1-1. Configuration Example of Storage Device

A configuration example of a storage device (magnetic storage device) 1 according to a first embodiment will be described with reference to FIG. 1. FIG. 1 is a diagram illustrating an example of a schematic configuration of the storage device 1 according to the first embodiment. The storage device 1 is a storage device that holds information by a magnetization direction of a magnetic substance.

As illustrated in FIG. 1, the storage device 1 includes a memory cell 501, a reference cell 502, and a plurality of sense amplifiers (SA) 511, 512, and 513. Note that one memory cell 501 and one reference cell 502 are illustrated in the example of FIG. 1, but actually there are a plurality of them, and the number of the sense amplifiers 511, 512, and 513 is also set according to the number of them.

The memory cell 501 includes a storage element 501*a* and a selection transistor 501*b*. The storage element 501*a* and the selection transistor 501*b* are connected in series. The memory cell 501 is a cell that records information using the storage element 501*a*.

The reference cell 502 includes a plurality of reference elements 502*a* and a plurality of selection transistors 502*b*. Each of the reference elements 502*a* and each of the selection transistors 502*b* are connected in series. In the example of FIG. 1, the number of the reference elements 502*a* is eight, and similarly, the number of the selection transistors 502*b* is also eight.

The reference cell 502 is a cell for High/Low (H/L) determination of a resistance value of the recorded information. The reference element 502*a* is an element for generating a reference resistance value. For example, the reference cell 502 uses a reference resistance value obtained by averaging eight resistance values. Note that the reference cell 502 is shared by a plurality of (for example, eight) memory cells 501.

The sense amplifier 511 is a first-stage sense amplifier for the memory cell 501. The sense amplifier 511 is an amplifier that amplifies a voltage.

The sense amplifier 512 is a first-stage sense amplifier for the reference cell 502. The sense amplifier 512 is an amplifier that amplifies a voltage similarly to the sense amplifier 511.

The sense amplifier 513 is a second-stage sense amplifier for both the memory cell 501 and the reference cell 502. The sense amplifier 513 compares a resistance value (voltage) of a read current flowing through the memory cell 501 with a reference resistance value (reference voltage) of a read current flowing through the reference cell 502, thereby determining information held by the memory cell 501 as a reading target.

In the storage device 1, the memory cells 501 and the reference cells 502 are arranged in an array (for example, in a matrix). The storage device 1 is configured to be capable of causing a read current to flow to a desired memory cell 501 and the reference cell 502 and determining a resistance state of the desired memory cell 501 with a resistance state of the reference cell 502 as a reference. Note that a configuration is not limited to the configuration illustrated in FIG. 1 as long as the above function can be implemented.

1-2. Configuration Example of Cell Structure of Storage Device

Figure 2:
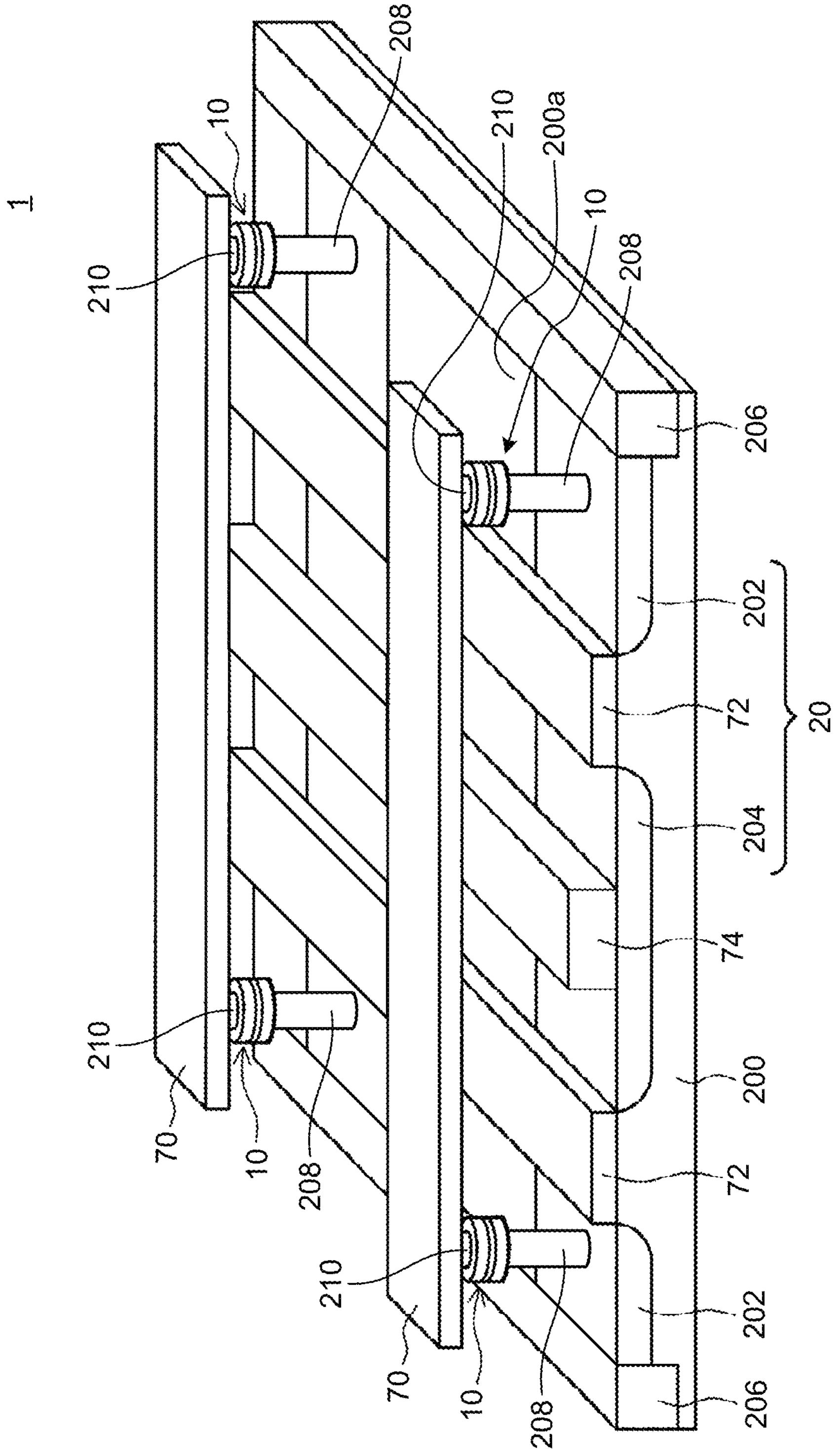
FIG. 2 is a perspective view illustrating an example of a schematic configuration of a cell structure of the storage device according to the first embodiment.
Figure 3:
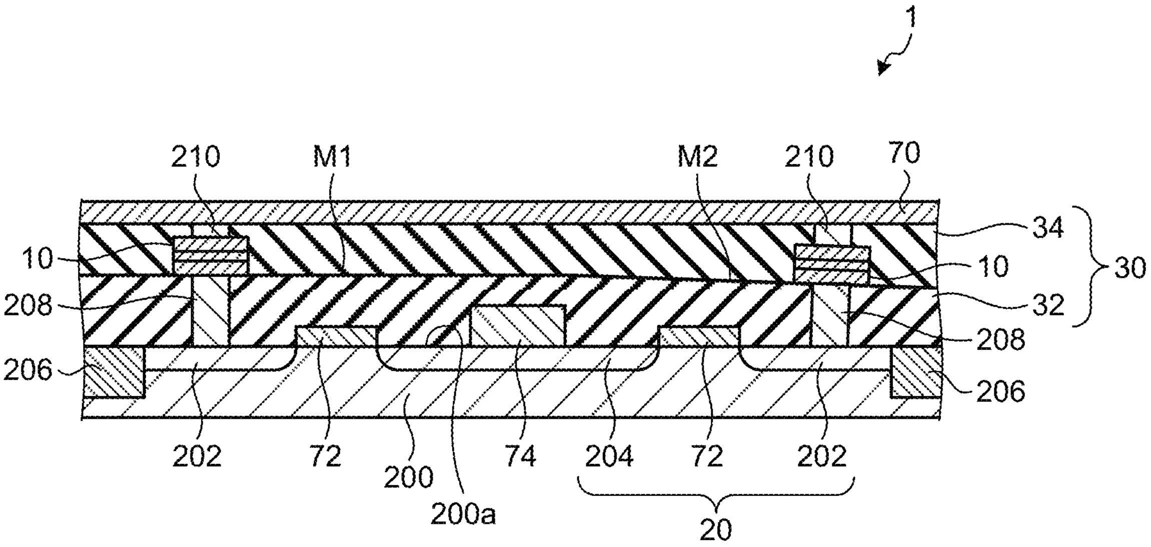
FIG. 3 is a cross-sectional view illustrating an example of the schematic configuration of the cell structure of the storage device according to the first embodiment.

A configuration example of a cell structure of the storage device 1 according to the first embodiment will be described with reference to FIGS. 2 and 3. FIG. 2 is a perspective view illustrating an example of a schematic configuration of the cell structure of the storage device 1 according to the first embodiment. FIG. 3 is a cross-sectional view illustrating an example of the schematic configuration of the cell structure of the storage device 1 according to the first embodiment.

Here, the cell structure of the storage device 1 according to the first embodiment is common to the memory cell 501 and the reference cell 502 described above. In the memory cell 501, the storage element 501*a* (see FIG. 1) is configured by an MTJ element 10 (see FIG. 2), and the selection transistor 501*b* (see FIG. 1) is configured by a selection transistor 20 (see FIG. 2). Similarly, in the reference cell 502, the reference element 502*a* (see FIG. 1) is configured by the MTJ element 10 (see FIG. 2), and the selection transistor 502*b* (see FIG. 1) is configured by the selection transistor 20 (see FIG. 2).

As illustrated in FIGS. 2 and 3, there are a plurality of the MTJ elements 10 in the cell structure of the storage device 1 according to the first embodiment. The MTJ elements 10 are each arranged in the vicinity of an intersection of two types of address wirings intersecting (orthogonal to) each other, for example, a bit line 70 and a gate electrode (word line) 72, and are provided in a matrix, for example. The MTJ element 10 has two terminals, one terminal is electrically connected to the bit line 70, and the other terminal is electrically connected to the selection transistor 20.

The selection transistor 20 is provided on a semiconductor substrate 200 such as a silicon substrate, and is formed in a region isolated by an element isolation layer 206 provided on the semiconductor substrate 200. The selection transistor 20 is a transistor for selecting the MTJ element 10. The selection transistor 20 includes the gate electrode (word line) 72, a source region 202, and a drain region 204.

Note that a plurality of cells (the memory cells 501 or the reference cells 502) are arrayed on the semiconductor substrate 200 in the storage device 1. In the examples of FIGS. 2 and 3, one cell includes the MTJ element 10 and one selection transistor 20 for selecting this MTJ element 10. Thus, a part corresponding to four cells is extracted and illustrated in FIG. 2.

The gate electrode 72 is provided so as to extend in the depth direction in FIGS. 2 and 3, and also serves as the word line. A wiring 74 is provided on the drain region 204, and the wiring 74 is electrically connected to the drain region 204. The drain region 204 is configured such that its potential can be appropriately changed via the wiring 74. In the examples of FIGS. 2 and 3, the drain region 204 is formed in common to the selection transistors 20 arranged adjacent to each other.

A contact layer 208 is provided on the source region 202, and the contact layer 208 is electrically connected to the source region 202. The MTJ element 10 is provided on the contact layer 208, and the MTJ element 10 is electrically connected to the contact layer 208. The contact layer 208 electrically connects the source region 202 of the selection transistor 20 and the MTJ element 10. The contact layer 208 is, for example, a contact via and is an example of a through wiring. The contact layer 208 functions as a lower electrode.

A contact layer 210 is provided on the MTJ element 10, and the contact layer 210 is electrically connected to the MTJ element 10. On the contact layer 210, the bit line 70 is provided so as to extend in a direction orthogonal to the gate electrode (word line) 72, and the bit line 70 is electrically connected to the contact layer 210. The contact layer 210 electrically connects the MTJ element 10 and the bit line 70. The contact layer 210 is, for example, a contact via and is an example of a through wiring. The contact layer 210 functions as an upper electrode.

As illustrated in FIG. 3, an insulating layer 30 is provided on a surface 200*a* which is an upper surface of the semiconductor substrate 200. The insulating layer 30 includes a lower insulating layer 32 and an upper insulating layer 34. The lower insulating layer 32 includes the respective contact layers 208, the respective gate electrodes (word lines) 72, the wiring 74, and the like. The upper insulating layer 34 includes the respective MTJ elements 10, the respective contact layers 210, the respective bit lines 70, and the like.

The lower insulating layer 32 has a plane M1 and an inclined surface M2. The plane M1 is a surface parallel to the surface (for example, a wafer surface) 200*a* of the semiconductor substrate 200. The inclined surface M2 is a plane inclined with respect to the surface 200*a* of the semiconductor substrate 200. The respective MTJ elements 10 are provided on the plane M1 and the inclined surface M2. The lower insulating layer 32 functions as a base layer when each of the MTJ elements 10 is formed. The lower insulating layer 32 is an example of the base layer. The inclined surface M2 corresponds to a first inclined surface.

That is, the plane M1 and the inclined surface M2 with respect to the surface of the semiconductor substrate 200 exist together in the lower insulating layer 32 serving as the base for forming the MTJ element 10. For example, the MTJ element 10 on the plane M1 corresponds to the reference element 502*a* (see FIG. 1), and the MTJ element 10 on the inclined surface M2 corresponds to the storage element 501*a* (see FIG. 1). Further, the MTJ element 10 includes a tunnel insulating layer (tunnel barrier layer), and this tunnel insulating layer corresponds to an insulating layer 104 (see FIG. 4) to be described later. Note that, as an example, the MTJ elements 10 are formed using the same MTJ material and the same element processing.

Here, in the MTJ element 10 formed on the inclined surface M2, a film formation rate of the tunnel insulating layer (for example, MgO) decreases as compared with that formed on the plane M1. When the MTJ element 10 is formed as the reference element 502*a* on the plane M1, which is an area having no inclination (or a gentle area) by utilizing the decrease in the film formation rate, it is possible to form the reference element 502*a* having a tunnel insulating layer whose film thickness is thick (resistance area product RA is high and reversal voltage Vc is high). That is, the thickness of the tunnel insulating layer of the reference element 502*a* on the plane M1 is thicker than a thickness of the tunnel insulating layer of the storage element 501*a* on the inclined surface M2. As a result, resistance to erroneous writing (read disturb) can be enhanced. Note that the resistance area product RA is a resistance area product ($\Omega \cdot m^2$) of a magnetoresistance effect element, and is also called an area resistance.

The storage device 1 is provided with a power supply circuit (not illustrated) capable of applying a desired current to the gate electrode (word line) 72 and the bit line 70. At the time of writing information, the power supply circuit applies a voltage to an address wiring corresponding to a desired cell (the memory cell 501) to which writing is to be performed, that is, the gate electrode (word line) 72 and the bit line 70, and causes a current to flow through the MTJ element 10. Note that, in the MTJ element 10, it is possible to write information of 1 or 0 by reversing a magnetic moment of a predetermined layer (a storage layer 106 to be described later) by spin torque magnetization reversal (to be described later in detail).

On the other hand, at the time of reading information, the storage device 1 causes the power supply circuit to apply a voltage to the gate electrode (word line) 72 corresponding to a desired cell (the memory cell 501 and the reference cell 502) from which reading is to be performed, and detects a current flowing from the bit line 70 through the MTJ element 10 to the selection transistor 20. Specifically, the storage device 1 causes a read current to flow to a desired memory cell 501 and the reference cell 502, and determines a resistance state (resistance value) of the desired memory cell 501 with a resistance state (reference resistance value) of the reference cell 502 as a reference.

Note that an electrical resistance of the MTJ element 10 changes depending on a direction of the magnetic moment in the predetermined layer (the storage layer 106 to be described later) of the MTJ element 10 due to the tunneling magnetoresistance (TMR) effect, the information of 1/0 can be read on the basis of a magnitude of a detected current value. At this time, since the current at the time of reading is much smaller than the current flowing at the time of writing, a magnetic direction in the predetermined layer of the MTJ element 10 does not change at the time of reading. That is, the MTJ element 10 can read information in a non-destructive manner.

1-3. Configuration Example of MTJ Element

Figure 4:
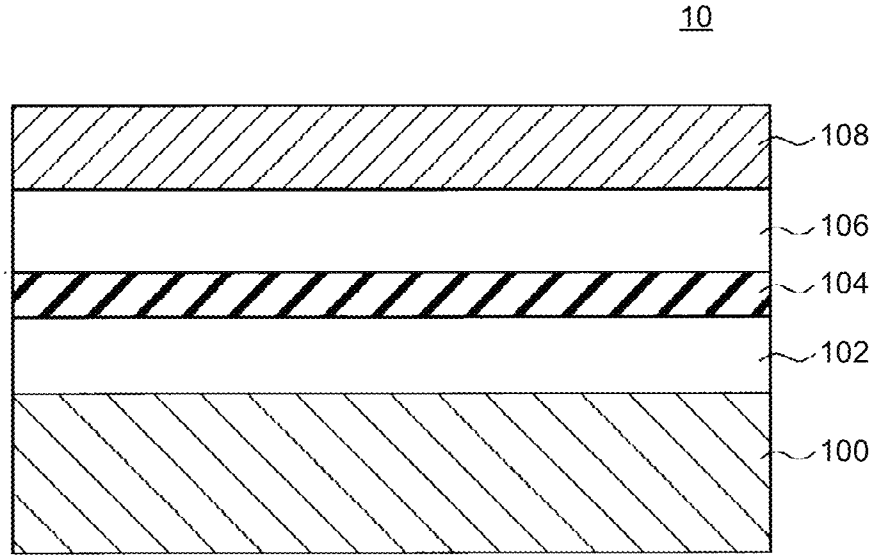
FIG. 4 is a cross-sectional view illustrating an example of a schematic configuration of an MTJ element according to the first embodiment.

A configuration example (basic structure) of the MTJ element 10 according to the first embodiment, for example, the MTJ element 10 of an STT-MRAM using spin torque magnetization reversal will be described with reference to FIG. 4. FIG. 4 is a cross-sectional view illustrating an example of a schematic configuration of the MTJ element 10. The MTJ element 10 is a magnetic storage element that stores one piece of information (1/0).

As illustrated in FIG. 4, the MTJ element 10 includes a base layer 100, a fixed layer 102, the insulating layer 104, the storage layer 106, and a cap layer 108. The base layer 100, the fixed layer 102, the insulating layer 104, the storage layer 106, and the cap layer 108 are laminated in the described order. The insulating layer 104 corresponds to a tunnel insulating layer (tunnel barrier layer).

The MTJ element 10 defines "0" and "1" of information by a relative angle between magnetization of the fixed layer 102 and magnetization of the storage layer 106. For example, the MTJ element 10 constitutes a perpendicular magnetization STT-MRAM. That is, a magnetization direction of a magnetic layer (the fixed layer 102 and the storage layer 106) included in a laminate structure of the MTJ element 10 is the direction perpendicular to the film surface (layer surface), in other words, the laminating direction of the laminate structure.

Although not illustrated in the example of FIG. 4, the MTJ element 10 is sandwiched between the upper electrode and the lower electrode (the respective contact layers 210 and 208). In the MTJ element 10, a voltage is applied between the lower electrode and the upper electrode of the MTJ element 10 via the gate electrode (word line) 72 and the bit line 70, and information is written to and read from the storage layer 106 of the MTJ element 10.

Note that the description is given assuming that, in the MTJ element 10, a magnetization direction of the storage layer 106 is reversed by the spin torque magnetization reversal, but a magnetization direction of the fixed layer 102 is not reversed, that is, the magnetization direction is fixed. Further, it is assumed that the insulating layer 104 is sandwiched between the fixed layer 102 and the storage layer 106.

The base layer 100 is provided on the semiconductor substrate 200 via the lower electrode (for example, the contact layer 208). For example, the base layer 100 is configured using a film for controlling a crystal orientation of the fixed layer 102 and improving an adhesion strength to the lower electrode.

The fixed layer 102 is a layer (magnetization-fixed layer) whose magnetization direction is fixed. The fixed layer 102 is formed using a ferromagnetic substance having a magnetic moment whose magnetization direction is fixed in the perpendicular direction, and a direction of the magnetic moment is fixed by a high coercive force or the like. The fixed layer 102 is formed in, for example, a laminated ferri-pinned structure including at least two ferromagnetic layers and a non-magnetic layer.

The insulating layer 104 is formed using various non-magnetic substances and the like, and is provided to be sandwiched between the fixed layer 102 and the storage layer 106. The insulating layer 104 is a layer formed using an insulating material such as MgO. In addition to the above-described materials, the insulating layer 104 can also be configured using, for example, various insulators, dielectrics, and semiconductors such as $Al_2O_3$, AlN, $SiO_2$, $Bi_2O_3$, $MgF_2$, CaF, $SrTiO_2$, $AlLaO_3$, and Al—N—O.

The storage layer 106 is a layer whose magnetization direction can be changed, for example, reversed. The storage layer 106 is formed using a ferromagnetic substance having a magnetic moment in which a magnetization direction freely changes in the perpendicular direction, and the direction of the magnetic moment changes in response to information to be stored. The storage layer 106 stores information according to a magnetization state of a magnetic substance, and may be formed of one layer or may have a structure in which a plurality of layers are laminated. The information is stored according to a direction of magnetization of the storage layer 106 having uniaxial anisotropy.

For example, writing is performed by applying a current to the storage layer 106 in the perpendicular direction and causing the spin torque magnetization reversal. That is, when a write current flowing in the laminating direction of the storage layer 106 and the fixed layer 102 is applied, the direction of magnetization of the storage layer 106 changes, and information is stored in the storage layer 106. Note that the fixed layer 102 is provided via the insulating layer 104 of a tunnel barrier film with respect to the storage layer 106 in which the direction of magnetization is reversed by spin injection, and is used as a reference of storage information (magnetization direction) of the storage layer 106.

The cap layer 108 is formed using, for example, various metal materials such as Ta, an alloy material, an oxide material, or the like. The cap layer 108 protects each laminated layer during manufacture of the MTJ element 10. Note that the cap layer 108 may function as a hard mask.

The MTJ element 10 having such a laminate structure is manufactured, for example, by continuously forming the base layer 100 to the cap layer 108 in a vacuum device, and then, forming a pattern of the MTJ element 10 by processing such as etching. The MTJ elements 10 are arranged in a matrix (see FIG. 2).

Here, for example, Co—Fe—B is used as the storage layer 106 and the fixed layer 102. The magnetization direction of the fixed layer 102 serves as the reference of information, and thus, should not be changed by recording or reading, but is not necessarily fixed in a specific direction. It is sufficient to cause the magnetization to be hardly changed as compared with the storage layer 106 by increasing a coercive force, a thickness, or a magnetic damping constant than that of the storage layer 106.

Further, when the magnetization is fixed, the fixed layer 102 may be indirectly fixed by bringing antiferromagnetic substances such as PtMn and IrMn into contact with the fixed layer 102 or magnetically coupling magnetic substances brought into contact with the antiferromagnetic substances via a non-magnetic substance such as Ru.

Further, in a perpendicular magnetization film in the storage layer 106, a composition is adjusted such that a magnitude of an effective demagnetizing field received by the perpendicular magnetization film is smaller than a saturation magnetization amount Ms. As described above, a Co—Fe—B composition of a ferromagnetic material of the storage layer 106 is selected, and the magnitude of the effective demagnetizing field received by the storage layer 106 is reduced to be smaller than the saturation magnetization amount Ms of the storage layer 106. As a result, the magnetization of the storage layer 106 is oriented in the perpendicular direction.

Further, in a case where the insulating layer 104, which is the tunnel barrier layer, is formed using magnesium oxide (MgO), a magnetoresistance change rate (MR ratio) can be increased. When the MR ratio is increased in this manner, the efficiency of spin injection in the MTJ element 10 can be improved, and the current density necessary for reversing the direction of magnetization of the storage layer 106 can be reduced. Further, in the present embodiment, a material of the insulating layer 104 as an intermediate layer may be replaced with a metal material, and the spin injection may be performed by the giant magnetoresistance (GMR) effect.

According to the configuration of the MTJ element 10 described above, the storage layer 106 is configured such that the magnitude of the effective demagnetizing field received by the storage layer 106 is smaller than the saturation magnetization amount Ms of the storage layer 106. As a result, the demagnetizing field received by the storage layer 106 decreases, and the amount of the write current necessary for reversing the direction of magnetization of the storage layer 106 can be reduced. This is because a reversal current of a perpendicular magnetization type STT-MRAM is applied since the storage layer 106 has perpendicular magnetic anisotropy, which is advantageous in terms of the demagnetizing field. Further, since the amount of the write current can be reduced without reducing the saturation magnetization amount Ms of the storage layer 106, it is possible to secure the thermal stability of the storage layer 106 by setting the saturation magnetization amount Ms of the storage layer 106 to a sufficient amount. As a result, the MTJ element 10 having an excellent characteristic balance can be configured.

Further, since the fixed layer 102 has the laminated ferri-pinned structure, the sensitivity of the fixed layer 102 is reduced with respect to an external magnetic field, a leakage magnetic field caused by the fixed layer 102 is shielded, and the perpendicular magnetic anisotropy of the fixed layer 102 can be enhanced by interlayer coupling of a plurality of magnetic layers. In this manner, the thermal stability as the information holding capability can be sufficiently secured, and thus, the MTJ element 10 having the excellent characteristic balance can be configured. Note that such a method of fixing the magnetization direction of the fixed layer 102 can be used regardless of whether the fixed layer 102 is below or above the storage layer 106.

Here, a structure in which the laminated ferri-pinned structure is provided on the lower side (that is, the base layer 100 side) with respect to the storage layer 106 is also referred to as a bottom-pinned structure, and a structure in which the laminated ferri-pinned structure is provided on the upper side (that is, the cap layer 108 side) with respect to the storage layer 106 is also referred to as a top-pinned structure. That is, the MTJ element 10 may have either the bottom-pinned structure or the top-pinned structure.

Note that, in the example of FIG. 4, a structure in which the insulating layer 104 and the fixed layer 102 are laminated in the downward direction with respect to the storage layer 106 is illustrated as the laminate structure of the MTJ element 10, but the structure of the MTJ element 10 is not particularly limited. For example, another layer may be added to the MTJ element 10, or the MTJ element 10 may be configured by interchanging positions of the fixed layer 102 and the storage layer 106. As an example, the MTJ element 10 may be configured by adding an insulating layer (upper tunnel barrier layer) and a fixed layer (upper magnetization-fixed layer) between the storage layer 106 and the cap layer 108 in the described order. In this case, the fixed layer 102 functions as a lower magnetization-fixed layer, and the insulating layer 104 functions as a lower tunnel barrier layer.

1-4. Writing and Reading of MTJ Element

Mechanisms for information writing and reading of the MTJ element 10 will be described. First, a mechanism for information writing of the MTJ element 10 will be described. In the MTJ element 10, information is written to the storage layer 106 using spin torque magnetization reversal as described above.

Here, details of the spin torque magnetization reversal will be described. Electrons are known to have two types of spin angular momentum. Therefore, the spin angular momentum is defined as two types of spin angular momentum, namely, upward spin angular momentum and downward spin angular momentum. The upward spin angular momentum and the downward spin angular momentum are the same amount inside a non-magnetic substance, but are different in amount inside a ferromagnetic substance.

Furthermore, here, a case is considered in which directions of magnetic moments of the fixed layer 102 and the storage layer 106 are different from each other in an antiparallel state in the MTJ element 10, and in this state, electrons are caused to enter the storage layer 106 from the fixed layer 102.

When the electrons pass through the fixed layer 102, spin polarization occurs, that is, a difference occurs in the amount of upward spin angular momentum and downward spin angular moment. Furthermore, when the thickness of the insulating layer 104 is sufficiently thin, the electrons can enter the storage layer 106 before the spin polarization relaxes and becomes a non-polarized state in a normal non-magnetic substance (the number of upward electrons and the number of downward electrons are the same).

In the storage layer 106, a direction of spin polarization is opposite to that of the electrons having entered. Therefore, some of the electrons that have entered are reversed, that is, the direction of the spin angular momentum changes in order to lower the energy of the entire system. At this time, since the spin angular momentum is stored in the entire system, a reaction equivalent to a total change of the spin angular momentum due to the reversed electrons is applied to the magnetic moment (magnetization direction) of the storage layer 106.

In a case where the current, that is, the number of electrons passing in a unit time is small, a total number of electrons that change the direction is also small, and thus, the change of the spin angular momentum generated in the magnetic moment of the storage layer 106 is also small. On the other hand, when the current, that is, the number of electrons passing in the unit time is increased, a desired change of the spin angular momentum can be given to the magnetic moment of the storage layer 106 in the unit time. A temporal change of the spin angular momentum is torque, and when the torque exceeds a predetermined threshold, the magnetic moment of the storage layer 106 starts to be reversed, and becomes stable in a state of being reversed by 180 degrees. Note that the magnetic moment of the storage layer 106 becomes stable in the state of being reversed by 180 degrees since there is an easy magnetization axis in the magnetic substance constituting the storage layer 106, and thus, there is uniaxial anisotropy By the mechanism as described above, the MTJ element 10 changes from the antiparallel state to a parallel state in which the directions of the magnetic moments of the fixed layer 102 and the storage layer 106 are the same.

Further, in a case where the current is caused to reversely flow in a direction in which electrons enter from the storage layer 106 to the fixed layer 102 in the parallel state, the electrons reversed by being reflected on the fixed layer 102 when reaching the fixed layer 102 apply torque to the storage layer 106 when entering the storage layer 106. Therefore, the magnetic moment of the storage layer 106 is reversed by the applied torque, and the MTJ element 10 changes from the parallel state to the antiparallel state.

However, a current amount of a reversal current for causing reversal from the parallel state to the antiparallel state is larger than that in the case of reversal from the antiparallel state to the parallel state. Note that, regarding the reversal from the parallel state to the antiparallel state, briefly, the reversal in the fixed layer 102 is difficult because the magnetic moment of the fixed layer 102 is fixed, and the magnetic moment of the storage layer 106 is reversed in order to store the spin angular momentum of the entire system. In this manner, the storage of 1/0 in the MTJ element 10 is performed by causing a current, equal to or larger than a predetermined threshold corresponding to each polarity, to flow in a direction from the fixed layer 102 toward the storage layer 106 or in its opposite direction. In this manner, 1/0 is written in the MTJ element 10 by reversing the magnetic moment of the storage layer 106 in the MTJ element 10 and changing a resistance state of the MTJ element 10.

Next, a mechanism for information reading in the MTJ element 10 will be described. In the MTJ element 10, reading of information from the storage layer 106 is performed using the magnetoresistance effect. Specifically, in a case where a current is caused to flow between the lower electrode (not illustrated) and the upper electrode (not illustrated) sandwiching the MTJ element 10, the resistance state of the MTJ element 10 changes on the basis of whether the directions of the magnetic moments of the fixed layer 102 and the storage layer 106 are parallel to each other or antiparallel to each other. Then, information stored in the storage layer 106 can be read by determining the resistance state of the MTJ element 10, that is, a magnitude of the electrical resistance indicated by the MTJ element 10.

1-5. In-Plane Magnetization STT-MRAM and Perpendicular Magnetization STT-MRAM STT-MRAMs include an in-plane magnetization STT-MRAM using a magnetic substance having magnetic anisotropy in the in-plane direction and a perpendicular magnetization STT-MRAM using a magnetic substance having magnetic anisotropy in the perpendicular direction. In general, the perpendicular magnetization STT-MRAM is considered to be more suitable for reduction in power and an increase in capacity than the in-plane magnetization STT-MRAM. This is because the perpendicular magnetization STT-MRAM has a lower energy barrier that needs to be exceeded at the time of spin torque magnetization reversal, and is advantageous in maintaining the thermal stability of a storage carrier in which high magnetic anisotropy of a perpendicular magnetization film is miniaturized for the increase in capacity.

Specifically, when a reversal current of the in-plane magnetization STT-MRAM is Ic_para, the reversal current from the parallel state to the antiparallel state is $$\text{Ic\_para} = \left(A \cdot \alpha \cdot Ms \cdot V/g(0)/P\right)\ (Hk + 2\pi\text{Ms}),$$

and the reversal current from the antiparallel state to the parallel state is $$\text{Ic\_para} = -\left(A \cdot \alpha \cdot Ms \cdot V/g(\pi)/P\right)\ (Hk + 2\pi\text{Ms}).$$

Further, when a reversal current of the perpendicular magnetization STT-MRAM is Ic_perp, the reversal current from the parallel state to the antiparallel state is $$\text{Ic\_perp} = \left(A \cdot \alpha \cdot Ms \cdot V/g(0)/P\right)\ (Hk - 4\pi\text{Ms}),$$

and the reversal current from the antiparallel state to the parallel state is $$\text{Ic\_perp} = -\left(A \cdot \alpha \cdot Ms \cdot V/g(\pi)/P\right)\ (Hk - 4\pi\text{Ms}).$$

Note that A is a constant, α is a damping constant, Ms is saturation magnetization, V is an element volume, g(0)P and g (π) P are coefficients corresponding to efficiencies at which spin torque is transferred to a counterpart magnetic layer in the parallel state and the antiparallel state, respectively, and Hk is magnetic anisotropy (see Non Patent Literature 1).

In each of the above formulas, when (Hk−4πMs) in the case of the perpendicular magnetization type is compared with (Hk+2πMs) in the case of the in-plane magnetization type, it can be understood that the perpendicular magnetization type is more suitable for reducing a storage current. That is, (Hk−4πMs) in the case of the perpendicular magnetization STT-MRAM is smaller than (Hk+2πMs) in the case of the in-plane magnetization STT-MRAM. Therefore, it can be seen that the perpendicular magnetization STT-MRAM is more suitable from the viewpoint of reducing the reversal current at the time of writing since the reversal current is smaller.

1-6. Method for Manufacturing MTJ Element

Figure 5:
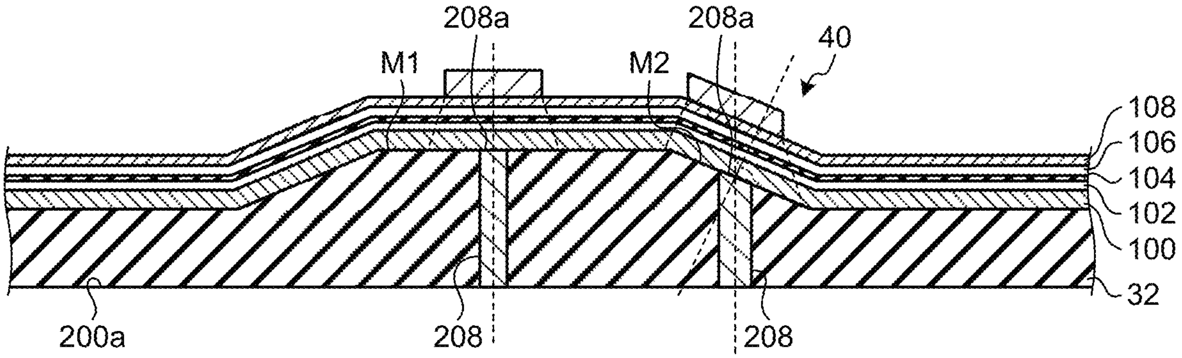
FIG. 5 is a first cross-sectional view for describing an example of a manufacturing process of the MTJ element according to the first embodiment.
Figure 6:
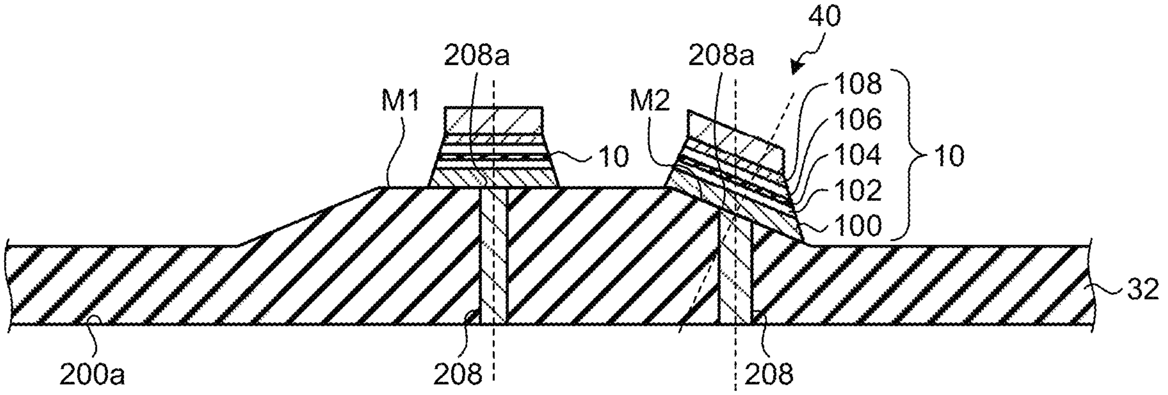
FIG. 6 is a second cross-sectional view for describing the example of the manufacturing process of the MTJ element according to the first embodiment.
Figure 7:
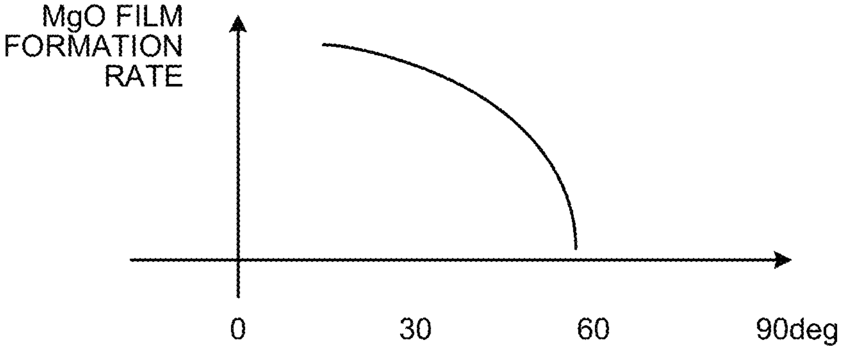
FIG. 7 is a graph illustrating an angle dependence of an MgO film formation rate according to the first embodiment.

An example of a method for manufacturing the MTJ element 10 (method for manufacturing the storage device 1) according to the first embodiment will be described with reference to FIGS. 5 and 6. FIGS. 5 and 6 are cross-sectional views for describing the example of a manufacturing process of the MTJ element 10 according to the first embodiment. FIG. 7 is a graph illustrating an angle dependence of an MgO film formation rate according to the first embodiment.

As illustrated in FIG. 5, the lower insulating layer 32 is laminated on the surface 200*a* of the substrate (the upper surface of the semiconductor substrate 200). The lower insulating layer 32 has a protrusion including the plane M1 and the inclined surface M2. The contact layer 208 is positioned on each of the plane M1 and the inclined surface M2, and is formed so as to extend in the perpendicular direction. Note that, in an exposed surface 208*a*, which is an upper surface of the contact layer 208, the contact layer 208 is exposed from the lower insulating layer 32. The exposed surface 208*a* in the inclined surface M2 is a surface inclined at the same inclination angle and in the same inclination direction as those of the inclined surface M2. The exposed surface 208*a* is included in the inclined surface M2. On the lower insulating layer 32, the base layer 100, the fixed layer 102, the insulating layer 104, the storage layer 106, and the cap layer 108 are laminated in the described order by a film forming method (for example, a DC magnetron sputtering method, an RF magnetron sputtering method, or the like) such as sputtering.

Furthermore, a photomask 40 is formed on the cap layer 108. The photomask 40 is formed, for example, by laminating a photoresist layer on the cap layer 108 by a spin coating method or the like and patterning the photoresist layer in accordance with a shape and a size of the MTJ element 10. The photomask 40 is used as a mask, and etching is performed sequentially on the cap layer 108, the storage layer 106, the insulating layer 104, the fixed layer 102, the base layer 100, and the like, whereby the MTJ element 10 is formed on the upper surface of the lower insulating layer 32, that is, the plane M1 and the inclined surface M2 as illustrated in FIG. 6. Note that, as the etching, for example, ion beam etching (IBE) may be used, reactive ion etching (RIE) may be used, or a combination thereof may be used.

According to such a manufacturing process, as illustrated in FIG. 5, a film from the base layer 100 to the cap layer 108 is continuously formed in a vacuum apparatus, and then patterning processing by etching or the like is performed, so that the MTJ element 10 is formed on the upper surface of the lower insulating layer 32 as illustrated in FIG. 6. At this time, the MTJ element 10 is formed on each of the plane M1 and the inclined surface M2 of the lower insulating layer 32. A thickness (film thickness) of the insulating layer 104 of the MTJ element 10 on the plane M1 is different from a thickness of the insulating layer 104 of the MTJ element 10 on the inclined surface M2. Furthermore, an area of a planar shape (planar shape parallel to the plane M1) of the MTJ element 10 on the plane M1 is different from an area of a planar shape (planar shape parallel to the inclined surface M2) of the MTJ element 10 on the inclined surface M2.

Here, as described above, the MTJ element 10 on the plane M1 corresponds to the reference element 502*a* (see FIG. 1), and the MTJ element 10 on the inclined surface M2 corresponds to the storage element 501*a* (see FIG. 1). Thus, a thickness of the insulating layer 104 of the reference element 502*a* on the plane M1 is thicker than a thickness of the insulating layer 104 of the storage element 501*a* on the inclined surface M2. As a result, in the reference element 502*a*, the resistance area product RA is higher and the reversal voltage Vc is higher than those of the storage element 501*a*, and thus, the resistance to erroneous writing (read disturb) can be enhanced.

Note that a resistance value of the reference element 502*a* and a resistance value of the storage element 501*a* may be the same, and an area of a planar shape of the reference element 502*a* on the plane M1 may be larger than an area of a planar shape of the storage element 501*a* on the inclined surface M2.

As illustrated in FIG. 6, when an inclination angle of the inclined surface M2 increases, the film formation rate of MgO, that is, a film formation rate of the insulating layer 104 decreases. That is, the thickness of the insulating layer 104 decreases as the inclination angle of the inclined surface M2 increases. By using this characteristic, it is possible to simultaneously form a plurality of the MTJ elements 10 having different thicknesses of the insulating layers 104, that is, the plurality of MTJ elements 10 having different writing (holding) characteristics.

Here, regarding the inclination angle, when the inclination angle is θ, it is desirable to satisfy a relational expression of $0\ (\text{deg}) < \theta \leq 45\ (\text{deg})$. When the inclination angle is inclined to 45 (deg), the thickness (for example, the film thickness of MgO) of the insulating layer 104 is about half on the basis of the COS law, and it is possible to cover a thickness range (for example, MgO film thickness range) of the insulating layer 104 assumed as the STT-MRAM. On the other hand, when the inclination angle is too large, there is a concern that a redeposit adhering to a side wall of the MTJ element 10 by etching cannot be sufficiently removed, and thus, 45 (deg) is set as an upper limit from a general beam angle.

Note that, in the above-described manufacturing process, it is preferable to form a film using the DC magnetron sputtering method for layers other than a layer made of oxide unless otherwise specified. Further, unless otherwise specified, an oxide layer is preferably formed by forming a metal layer using the RF magnetron sputtering method or the DC magnetron sputtering method, performing an oxidation treatment (heat treatment) after the film formation, and converting the formed metal layer into the oxide layer.

1-7. First Modification of Base

Figure 8:
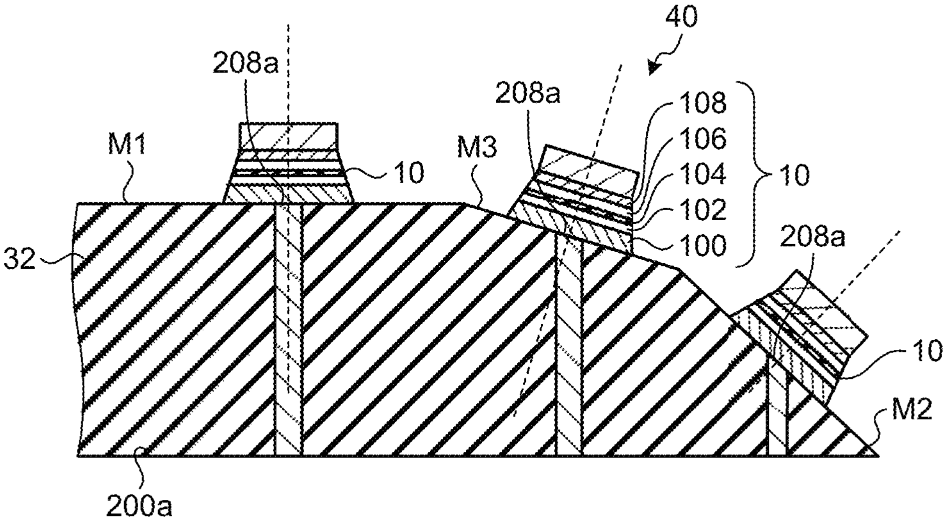
FIG. 8 is a cross-sectional view for describing a first modification of a base according to the first embodiment.

A first modification of a base (the lower insulating layer 32) according to the first embodiment will be described with reference to FIG. 8. FIG. 8 is a cross-sectional view for describing the first modification of the base (lower insulating layer 32) according to the first embodiment.

As illustrated in FIG. 8, the lower insulating layer 32 has the plane M1 and the two inclined surfaces M2 and M3 having different inclination angles. In this case, it is possible to simultaneously form three MTJ elements 10 having different thicknesses of the insulating layers 104, that is, the three MTJ elements 10 having different writing (holding) characteristics. The two inclined surfaces M2 and M3 correspond to the first inclined surface and a second inclined surface.

In the first modification, the inclined surface M3 is a surface inclined at the inclination angle smaller than the inclination angle of the inclined surface M2. For example, the MTJ element 10 on the inclined surface M3 or the plane M1 is used as the reference element 502*a* (see FIG. 1), and the MTJ element 10 on the inclined surface M2 is used as the storage element 501*a* (see FIG. 1). That is, the reference element 502*a* is provided at least on the inclined surface M3 or the plane M1 having the inclination angle smaller than that of the inclined surface M2 on which the storage element 501*a* is provided. Thus, a thickness of the insulating layer 104 of the reference element 502*a* is thicker than a thickness of the insulating layer 104 of the storage element 501*a*, and the resistance area product RA and the reversal voltage Vc of the reference element 502*a* are greater than those of the storage element 501*a*, so that resistance to erroneous writing (read disturb) can be improved.

Note that the number of the inclined surfaces M2 and M3 having different inclination angles is not particularly limited, and is changed, for example, in accordance with the number of required different writing characteristics. That is, n types of the MTJ elements 10 having different writing characteristics can be simultaneously formed by setting the inclination to n (n is an integer of two or more) stages.

1-8. Second Modification of Base

Figure 9:
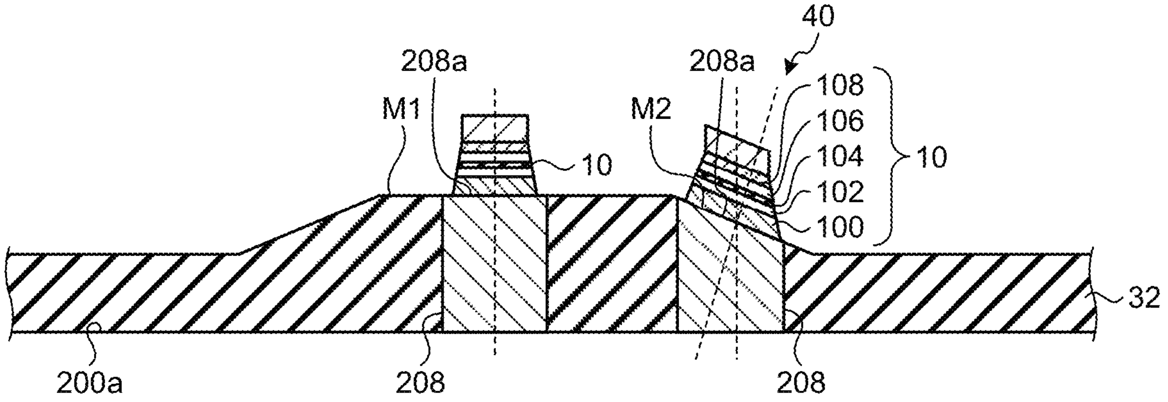
FIG. 9 is a cross-sectional view for describing a second modification of the base according to the first embodiment.

A second modification of the base (lower insulating layer 32) according to the first embodiment will be described with reference to FIG. 9. FIG. 9 is a cross-sectional view for describing the second modification of the base (lower insulating layer 32) according to the first embodiment.

As illustrated in FIG. 9, the lower insulating layer 32 includes a plurality of the contact layers 208 each having a width (length in the in-plane direction) larger than that in FIG. 6. The MTJ element 10 is provided in the exposed surface 208*a* which is an upper surface of the contact layer 208. An area of the exposed surface 208*a* is equal to or larger than an area of a lower surface of the MTJ element 10. The exposed surface 208*a* in the inclined surface M2 is included in the inclined surface M2. The exposed surface 208*a* functions as the inclined surface M2.

Also in the second modification, the MTJ element 10 on the plane M1 corresponds to the reference element 502*a* (see FIG. 1), and the MTJ element 10 on the inclined surface M2 corresponds to the storage element 501*a* (see FIG. 1). Thus, a thickness of the insulating layer 104 of the reference element 502*a* is thicker than a thickness of the insulating layer 104 of the storage element 501*a*, and the resistance area product RA and the reversal voltage Vc of the reference element 502*a* are greater than those of the storage element 501*a*, so that resistance to erroneous writing (read disturb) can be improved.

1-9. Method for Forming Inclined Surface of Base

Figure 10:
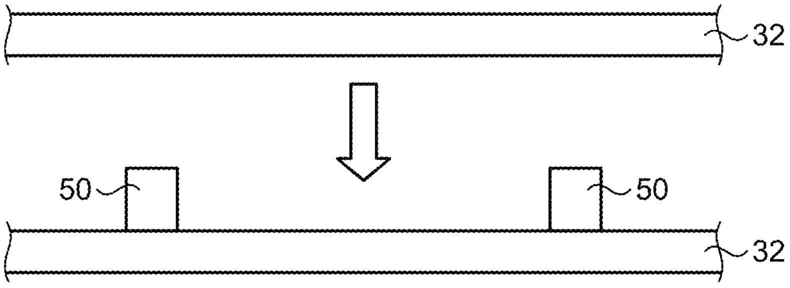
FIG. 10 is a first explanatory diagram for describing an example of a formation process of an inclined surface of the base according to the first embodiment.
Figure 11:
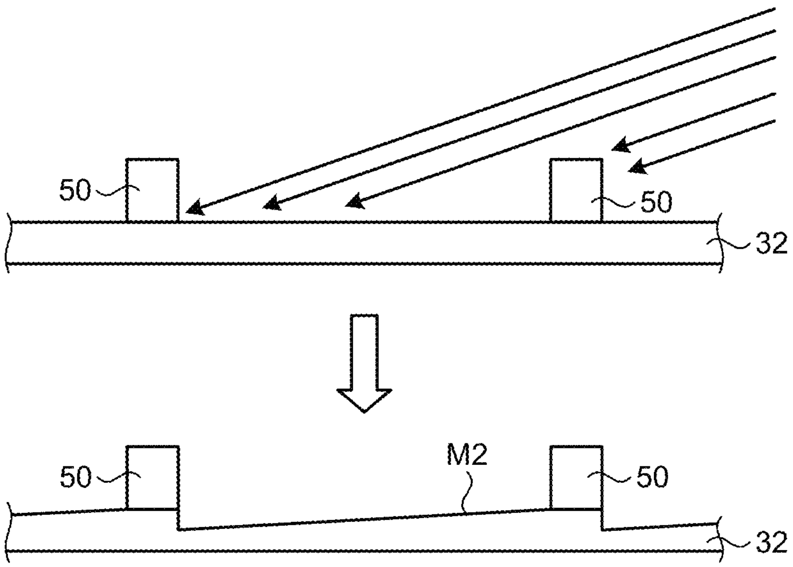
FIG. 11 is a second explanatory diagram for describing the example of the formation process of the inclined surface of the base according to the first embodiment.
Figure 12:
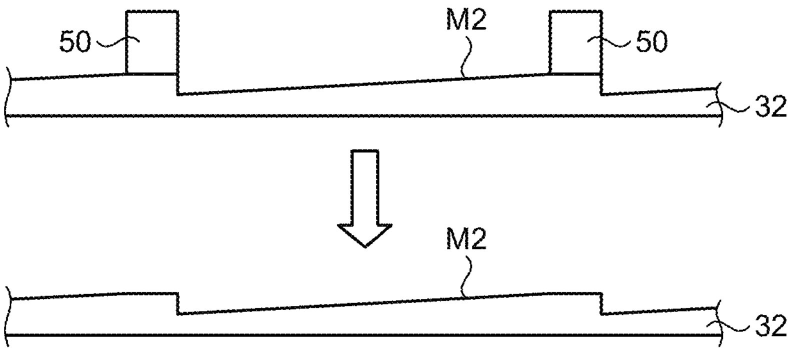
FIG. 12 is a third explanatory diagram for describing the example of the formation process of the inclined surface of the base according to the first embodiment.

An example of a method of forming the inclined surface M2 of the base (lower insulating layer 32) according to the first embodiment will be described with reference to FIGS. 10 to 12. FIGS. 10 to 12 are diagrams for describing an example of a formation process of the inclined surface M2 of the base according to the first embodiment.

As illustrated in FIG. 10, a resist layer 50 is patterned on the lower insulating layer 32 of the base. As illustrated in FIG. 11, the lower insulating layer 32 is etched by an ion beam incident on an upper surface of the lower insulating layer 32 at a predetermined inclination angle (oblique ion beam incident on the upper surface of the lower insulating layer 32). At this time, a part of the ion beam is shielded by the resist layer 50, and the inclined surface M2 is formed on the lower insulating layer 32. Then, the resist layer 50 is removed after etching as illustrated in FIG. 12. As a result, the lower insulating layer 32 having the inclined surface M2 can be obtained. In such a formation step, an inclination angle and an inclination direction of the inclined surface M2 can be adjusted by controlling the patterning of the resist layer 50 and an incident angle of the ion beam, and the presence or absence of the inclined surface M2 can be selected.

Note that a formation process of the inclined surface M2 is not limited to the formation process illustrated in FIGS. 10 to 12 as long as the inclined surface M2 can be formed. Further, the base is not limited to the lower insulating layer 32 as long as the base (base layer) can have the inclined surface M2.

1-10. Action and Effect

As described above, according to the first embodiment, the lower insulating layer 32, which is an example of the base layer, has the inclined surface (first inclined surface) M2 inclined with respect to the surface 200*a* of the semiconductor substrate 200, and the inclined surface (second inclined surface) M3 (see FIG. 8) inclined with respect to the plane M1 (see FIG. 1) parallel to the surface 200*a* or the surface 200*a* at the inclination angle smaller than the inclination angle of the inclined surface M2. The storage element 501*a* is provided on the inclined surface M2, and the reference element 502*a* is provided on the plane M1 or the inclined surface M3. As a result, since the insulating layer 104 of the reference element 502*a* is thicker than the insulating layer 104 of the storage element 501*a*, the resistance area product RA and the reversal voltage Vc of the reference element 502*a* are greater than those of the storage element 501*a*. Therefore, the resistance to the erroneous writing (read disturb) can be enhanced, and the occurrence of the erroneous writing can be suppressed.

Further, the lower insulating layer 32 may have the plane M1 and the inclined surface M3, and the plurality of reference elements 502*a* may be provided on the plane M1 and the inclined surface M3. Also in such a case, the occurrence of the erroneous writing can be suppressed.

Further, the resistance value of the reference element 502*a* may be the same as the resistance value of the storage element 501*a*, and the area of the planar shape parallel to the plane M1 in the reference element 502*a* may be larger than the area of the planar shape parallel to the inclined surface M2 in the storage element 501*a*.

Further, the plurality of storage elements 501*a* may be provided on the inclined surface M2 and the plane M1. As a result, the thickness of the insulating layer 104 of the storage element 501*a* on the inclined surface M2 is different from the thickness of the insulating layer 104 of the storage element 501*a* on the plane M1. Therefore, it is possible to simultaneously form the plurality of storage elements 501*a* having different thicknesses of the insulating layers 104, that is, the plurality of storage elements 501*a* having different writing (holding) characteristics. That is, the number of manufacturing steps can be reduced, and productivity can be improved.

Further, the plurality of storage elements 501*a* may be provided on the inclined surface M3 in addition to the inclined surface M2 and the plane M1. As a result, the thickness of the insulating layer 104 of the storage element 501*a* on the inclined surface M2, the thickness of the insulating layer 104 of the storage element 501*a* on the plane M1, and the thickness of the insulating layer 104 of the storage element 501*a* on the inclined surface M3 are different. Therefore, it is possible to simultaneously form the plurality of MTJ elements 10 having different writing (holding) characteristics, and the productivity can be improved.

Further, the lower insulating layer 32 may include the contact layer 208, which is an example of the through wiring electrically connected to the reference element 502*a* provided on the plane M1 or the inclined surface M3. As a result, an electrical wiring for the reference element 502*a* can be simplified.

Further, the plane M1 or the inclined surface M3 may include the exposed surface 208*a* where the contact layer 208 is exposed from the lower insulating layer 32, and the reference element 502*a* electrically connected to the contact layer 208 may be provided in the exposed surface 208*a* (see FIG. 9). Also in such a case, the occurrence of the erroneous writing can be suppressed.

Further, the lower insulating layer 32 may include the contact layer 208 which is an example of the through wiring electrically connected to the storage element 501*a* provided on the inclined surface M2. As a result, an electrical wiring for the storage element 501*a* can be simplified.

Further, the inclined surface M2 may include the exposed surface 208*a* where the contact layer 208 is exposed from the lower insulating layer 32, and the storage element 501*a* electrically connected to the contact layer 208 may be provided in the exposed surface 208*a* (see FIG. 9). Also in such a case, the occurrence of the erroneous writing can be suppressed.

2. Second Embodiment

2-1. Method for Manufacturing MTJ Element

Figure 13:
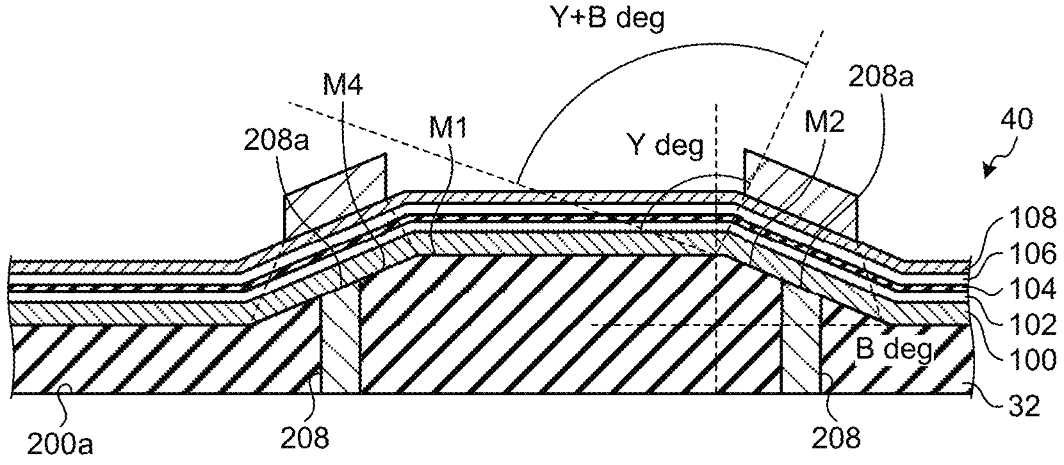
FIG. 13 is a first cross-sectional view for describing an example of a manufacturing process of an MTJ element according to a second embodiment.
Figure 14:
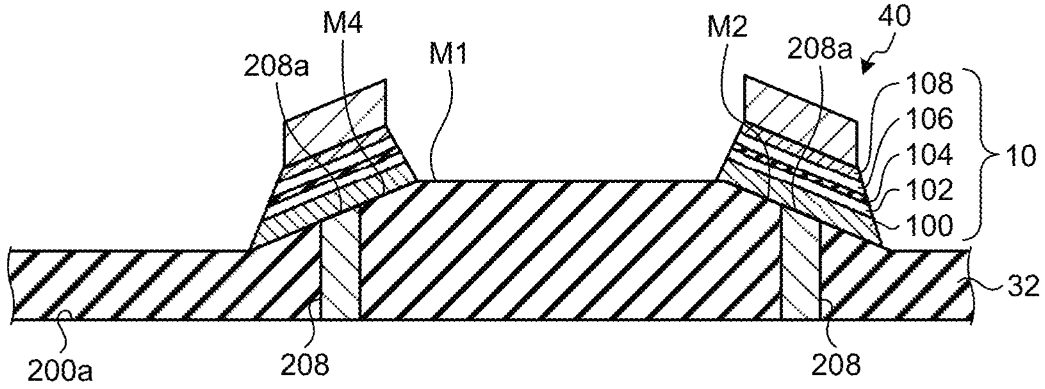
FIG. 14 is a second cross-sectional view for describing the example of the manufacturing process of the MTJ element according to the second embodiment.
Figure 15:
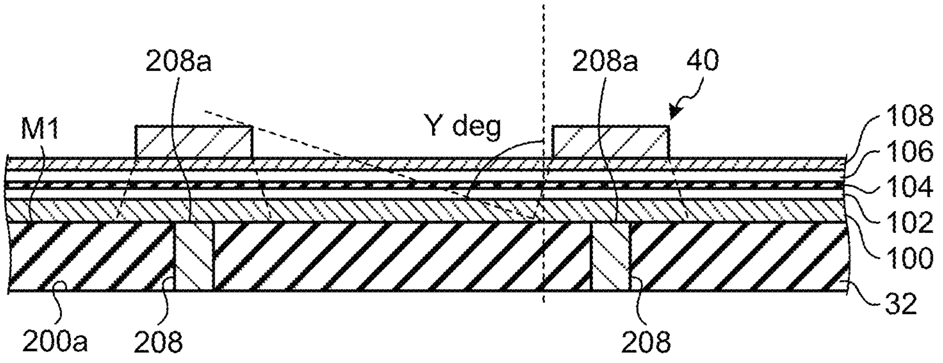
FIG. 15 is a cross-sectional view for describing a comparative example of the manufacturing process of the MTJ element according to the second embodiment.

An example of a method for manufacturing the MTJ element 10 (method for manufacturing the storage device 1) according to a second embodiment will be described with reference to FIGS. 13 to 15. FIGS. 13 and 14 are cross-sectional views for describing an example of a manufacturing process of the MTJ element 10 according to the second embodiment. FIG. 15 is a cross-sectional view for describing a comparative example of the manufacturing process of the MTJ element 10 according to the second embodiment.

As illustrated in FIG. 13, the lower insulating layer 32 is laminated on the surface 200*a* of a substrate (an upper surface of the semiconductor substrate 200). The lower insulating layer 32 has a protrusion including the plane M1 and a plurality of inclined surfaces M2 and M4. The contact layer 208 is positioned on each of the inclined surfaces M2 and M4, and is formed so as to extend in the perpendicular direction. The plurality of inclined surfaces M2 and M4 correspond to a first inclined surface and a third inclined surface.

Note that, in the exposed surface 208*a*, which is an upper surface of the contact layer 208, the contact layer 208 is exposed from the lower insulating layer 32. The exposed surface 208*a* in the inclined surface M2 is a surface inclined at the same inclination angle and in the same inclination direction as those of the inclined surface M2. The exposed surface 208*a* in the inclined surface M4 is a surface inclined at the same inclination angle and in the same inclination direction as those of the inclined surface M4. These exposed surfaces 208*a* are included in the inclined surfaces M2 and M4, respectively. On the lower insulating layer 32, the base layer 100, the fixed layer 102, the insulating layer 104, the storage layer 106, and the cap layer 108 are laminated in the described order by a film forming method (for example, a DC magnetron sputtering method, an RF magnetron sputtering method, or the like) such as sputtering.

Furthermore, the photomask 40 is formed on the cap layer 108. The photomask 40 is formed, for example, by laminating a photoresist layer on the cap layer 108 by a spin coating method or the like and patterning the photoresist layer in accordance with a shape and a size of the MTJ element 10. The photomask 40 is used as a mask, and etching is performed sequentially on the cap layer 108, the storage layer 106, the insulating layer 104, the fixed layer 102, the base layer 100, and the like, whereby the MTJ element 10 is formed on an upper surface of the lower insulating layer 32, that is, on each of the inclined surfaces M2 and M4 as illustrated in FIG. 14. Note that, as the etching, for example, ion beam etching (IBE) may be used, reactive ion etching (RIE) may be used, or a combination thereof may be used.

According to such a manufacturing process, as illustrated in FIG. 13, a film from the base layer 100 to the cap layer 108 is continuously formed in a vacuum apparatus, and then patterning processing by etching or the like is performed, so that the MTJ element 10 is formed on the upper surface of the lower insulating layer 32 as illustrated in FIG. 14. At this time, the MTJ element 10 is formed on each of the inclined surfaces M2 and M4 of the lower insulating layer 32. The inclination angles of the inclined surfaces M2 and M4 are the same. Thus, a thickness (film thickness) of the insulating layer 104 of the MTJ element 10 on the inclined surface M2 is the same as a thickness of the insulating layer 104 of the MTJ element 10 on the inclined surface M4.

In the example of FIG. 13, two inclined surfaces M2 and M4 are provided in the lower insulating layer 32 at a place where the MTJ elements 10 are formed at a place where an interval between the MTJ elements 10 is narrowed (for example, the narrowest place). For example, the lower insulating layer 32 between the adjacent MTJ elements 10 is formed in a protruding shape as illustrated in FIG. 13. The two inclined surfaces M2 and M4 are formed such that a separation distance between the surfaces gradually increases toward the surface 200*a* of the semiconductor substrate 200.

One of the two inclined surfaces M2 and M4 has +a degree (positive value) with respect to the in-plane direction (for example, in a wafer film surface direction), and the other has −b degree (negative value) with respect to the in-plane direction. The numerical values a and b may be the same or different. In this manner, the respective inclination directions of the two inclined surfaces M2 are different. Note that "+" and "−" indicate that the inclination directions are opposite. For example, the inclination directions may be defined two-dimensionally or three-dimensionally.

According to such a layout, an upper limit of an angle at which an ion beam is shielded can be increased by an inclination angle B (deg) of the inclined surface M2. This upper limit of the angle is Y+B (deg). That is, it is possible to relatively lay down and emit the ion beam by expanding an incident angle range of the ion beam and to remove a redeposit adhering to a side wall of the MTJ element 10. Therefore, when element processing by ion beam etching (IBE) is performed, shielding of the ion beam by the MTJ element 10 is mitigated, and a short circuit failure can be suppressed even if the interval between the MTJ elements 10 is narrowed, and thus, the storage device 1 with a higher density can be created.

On the other hand, in the comparative example illustrated in FIG. 15, the lower insulating layer 32 has only the plane M1, and each of the MTJ elements 10 is formed on the plane M1. In this layout, when an ion beam is laid down by Y (deg) or more, the ion beam is shielded by the adjacent MTJ element 10 and the photomask 40 thereon. That is, at a place where the interval between elements is narrowed, the ion beam at the time of ion beam etching (IBE) processing is sometimes blocked by one adjacent element.

In this manner, in the comparative example, in a case where an angle of the ion beam is close to horizontal, the ion beam is shielded by the adjacent MTJ element 10 and the photomask 40 thereon, and removal of an accretion adhering to the side wall of the MTJ element 10, that is, the re-deposit becomes insufficient, and a short circuit failure sometimes occurs. In order to avoid this short circuit failure, by expanding an incident angle range of the ion beam as described above, it is possible to relatively lay down and emit the ion beam and to remove a redeposit adhering to a side wall of the MTJ element 10.

2-2. Action and Effect

As described above, according to the second embodiment, the lower insulating layer 32 has the plurality of inclined surfaces (the first inclined surface and the third inclined surface) M2 and M4 (see FIG. 14) having different inclination directions with respect to the surface 200*a* of the semiconductor substrate 200, and the plurality of storage elements 501*a* are provided on the respective inclined surfaces M2 and M4. With this layout, it is possible to suppress elements from mutually shielding ion beams at the time of film formation of the adjacent storage elements 501*a*, and it is easy to remove the redeposit (reattached deposit) causing a short circuit failure element from the storage elements 501*a*. Therefore, since it is possible to suppress a decrease in yield, productivity can be improved.

Further, the respective inclined surfaces M2 and M4 may be two inclined surfaces in which a separation distance between the surfaces gradually increases toward the surface 200*a* of the semiconductor substrate 200. With this layout, it is possible to further suppress the elements from mutually shielding the ion beams at the time of film formation of the adjacent storage elements 501*a*, and it is easy to remove the redeposit, which causes the short circuit failure element, from the storage elements 501*a*. Therefore, it is possible to suppress the decrease in yield and reliably improve the productivity.

Further, the inclination angles of the respective inclined surfaces M2 and M4 may be the same or different. At this time, for example, the thickness of the insulating layer 104 of each of the storage elements 501*a* can be changed by adjusting the inclination angle of each of the inclined surfaces M2 and M4, and the plurality of storage elements 501*a* having different writing (holding) characteristics can be formed.

3. Other Embodiments

The configurations according to the above embodiments may be implemented in various different forms other than the above embodiments. For example, the configurations are not limited to the above-described examples, and may have various modes. Further, for example, the configurations, processing procedures, specific names, and information including various types of data and parameters illustrated in the above document and drawings can be arbitrarily changed unless otherwise specified.

Further, each component of each device illustrated is a functional concept, and does not necessarily need to be physically configured as illustrated. That is, the specific form of distribution/integration of each device is not limited to those illustrated in the drawings, and all or a part thereof may be functionally or physically distributed/integrated into arbitrary units according to various loads and usage situations.

For example, each of the MTJ elements 10 according to each of the above-described embodiments and modifications thereof may be used as a magnetoresistive element, and a storage device such as a hard disk drive (HDD) may be configured as the storage device 1.

4. Configuration Example of Electronic Device

As an electronic device including the storage device 1 according to each of the above-described embodiments (including each modification), an imaging device 300 and a game device 900 will be described with reference to FIGS. 16 to 18. For example, the imaging device 300 and the game device 900 use the storage device 1 according to each of the above-described embodiments as a memory. Examples of the memory include a flash memory and the like.

4-1. Imaging Device

The imaging device 300 including the storage device 1 according to any one of the above-described embodiments will be described with reference to FIG. 16. FIG. 16 is a diagram illustrating an example of a schematic configuration of the imaging device 300 including the storage device 1 according to any one of the above-described embodiments. Examples of the imaging device 300 include electronic devices such as a digital still camera, a video camera, a smartphone having an imaging function, and a mobile phone.

Figure 16:
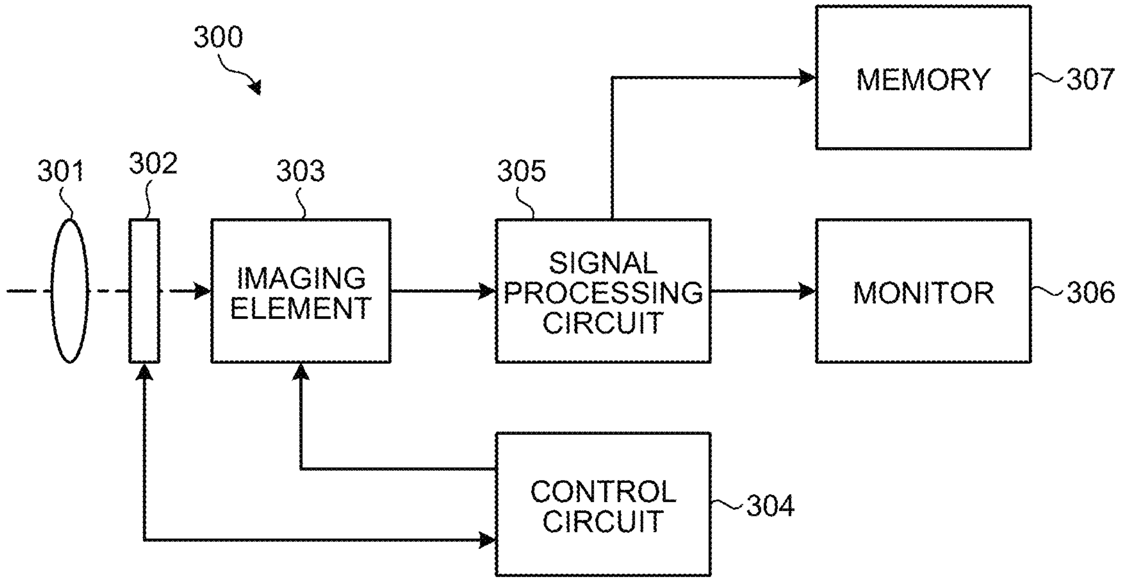
FIG. 16 is a diagram illustrating an example of a schematic configuration of an imaging device including the storage device according to the first embodiment or a storage device according to the second embodiment.

As illustrated in FIG. 16, the imaging device 300 includes an optical system 301, a shutter device 302, an imaging element 303, a control circuit (drive circuit) 304, a signal processing circuit 305, a monitor 306, and a memory 307. The imaging device 300 can capture a still image and a moving image.

The optical system 301 includes one or a plurality of lenses. The optical system 301 guides light (incident light) from a subject to the imaging element 303 and forms an image on a light receiving surface of the imaging element 303.

The shutter device 302 is disposed between the optical system 301 and the imaging element 303. The shutter device 302 controls a light irradiation period and a light shielding period with respect to the imaging element 303 according to the control of the control circuit 304.

The imaging element 303 accumulates signal charges for a certain period according to light formed on the light receiving surface via the optical system 301 and the shutter device 302. The signal charges accumulated in the imaging element 303 is transferred in accordance with a drive signal (timing signal) supplied from the control circuit 304.

The control circuit 304 outputs the drive signal for controlling a transfer operation of the imaging element 303 and a shutter operation of the shutter device 302 to drive the imaging element 303 and the shutter device 302.

The signal processing circuit 305 performs various types of signal processing on the signal charges output from the imaging element 303. An image (image data) obtained by performing the signal processing by the signal processing circuit 305 is supplied to the monitor 306 and also supplied to the memory 307.

The monitor 306 displays a moving image or a still image captured by the imaging element 303 based on the image data supplied from the signal processing circuit 305. As the monitor 306, for example, a panel type display device such as a liquid crystal panel or an organic electro luminescence (EL) panel is used.

The memory 307 stores the image data supplied from the signal processing circuit 305, that is, image data of the moving image or the still image captured by the imaging element 303. The memory 307 includes the storage device 1 according to any one of the above-described embodiments.

Even in the imaging device 300 configured as described above, improvement in productivity can be realized by using the storage device 1 described above as the memory 307.

4-2. Game Device

The game device 900 including the storage device 1 according to any one of the above-described embodiments will be described with reference to FIGS. 17 and 18. FIG. 17 is a perspective view (external perspective view) illustrating an example of the schematic configuration of the game device 900 including the storage device 1 according to any one of the above-described embodiments. FIG. 18 is a block diagram illustrating an example of the schematic configuration of the game device 900.

Figure 17:
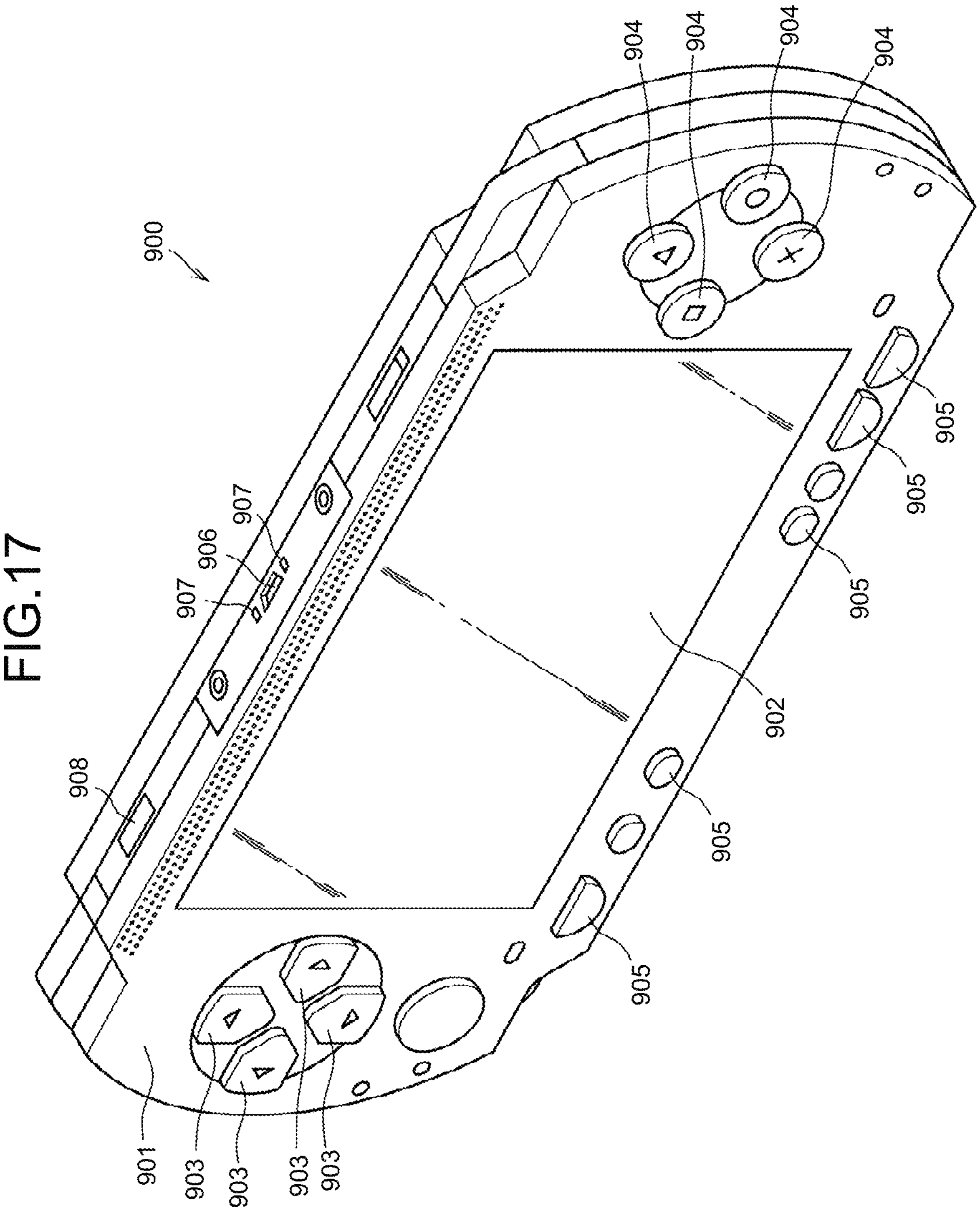
FIG. 17 is a perspective view illustrating an example of an appearance of a game apparatus including the storage device according to the first or second embodiment.

As illustrated in FIG. 17, for example, the game device 900 has an appearance in which each component is disposed inside and outside an outer casing 901 formed in a horizontally long flat shape.

On the front surface of the outer casing 901, a display panel 902 is provided at the center thereof in the longitudinal direction. Further, operation keys 903 and operation keys 904 are provided on the left and right sides of the display panel 902, respectively, spaced apart from each other in the circumferential direction. An operation key 905 is provided at a lower end of the front surface of the outer casing 901. The operation keys 903, 904, and 905 function as direction keys, determination keys, or the like, and are used for selection of menu items displayed on the display panel 902, progress of a game, or the like.

On the upper surface of the outer casing 901, a connection terminal 906 for connecting an external device, a power supply terminal 907, a light receiving window 908 for performing infrared communication with the external device, and the like are provided.

Figure 18:
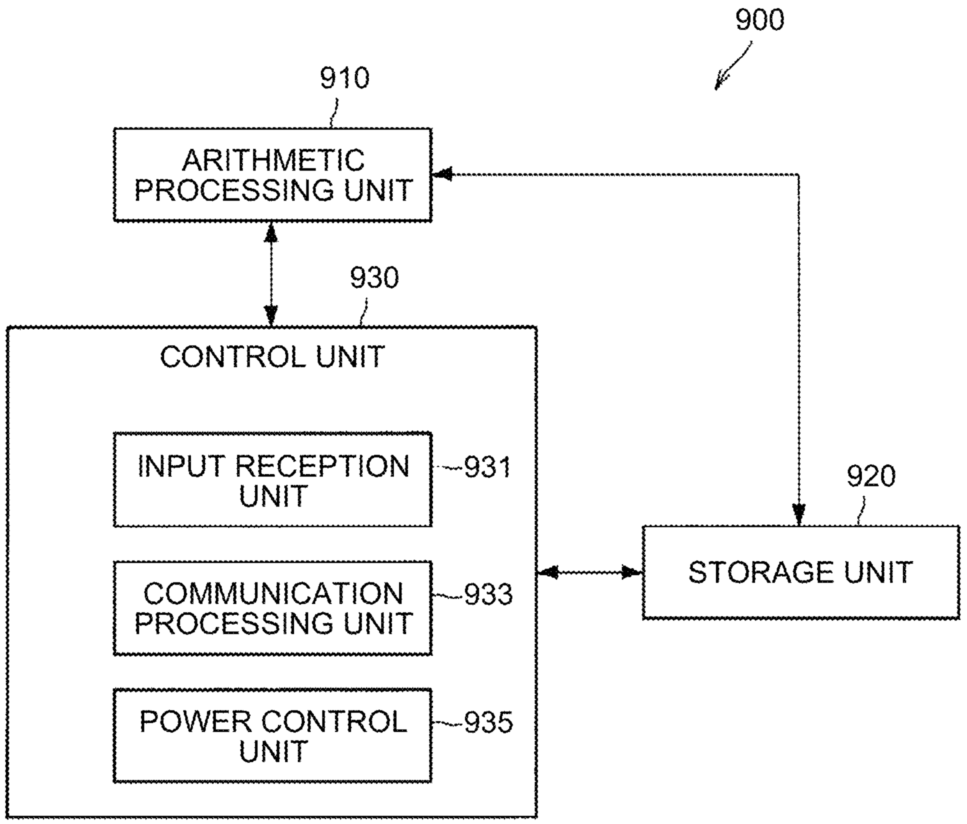
FIG. 18 is a block diagram illustrating an example of a schematic configuration of the game apparatus of FIG. 17.

As illustrated in FIG. 18, the game device 900 includes an arithmetic processing unit 910 including a central processing unit (CPU), a storage unit 920 that stores various types of information, and a controller 930 that controls each configuration of the game device 900. Power is supplied to the arithmetic processing unit 910 and the controller 930 from, for example, a battery (not illustrated) or the like.

The arithmetic processing unit 910 generates a menu screen for allowing a user to set various types of information or select an application. In addition, the arithmetic processing unit 910 executes the application selected by the user.

The storage unit 920 stores various types of information set by the user. The storage unit 920 includes the storage device 1 according to any one of the above-described embodiments.

The controller 930 includes an input receiving unit 931, a communication processing unit 933, and a power controller 935. The input receiving unit 931 detects, for example, the states of the operation keys 903, 904, and 905. Furthermore, the communication processing unit 933 performs communication processing with an external device. The power controller 935 controls power supplied to each unit of the game device 900.

Even in the game device 900 configured as described above, improvement in productivity can be realized by using the storage device 1 described above as the storage unit 920.

It is noted that the storage device 1 according to each of the above-described embodiments may be mounted on the same semiconductor chip together with a semiconductor circuit forming an arithmetic device or the like to form a semiconductor device (System-on-a-Chip: SoC).

Furthermore, the storage device 1 according to each of the above-described embodiments can be mounted on various electronic devices on which a memory (storage unit) can be mounted as described above. For example, the storage device 1 may be mounted on various electronic devices such as a notebook personal computer (PC), a mobile device (for example, a smartphone, a tablet PC, or the like), a personal digital assistant (PDA), a wearable device, and a music device in addition to the imaging device 300 and the game device 900. For example, the storage device 1 is used as various memories such as a storage.

5. Appendix

Note that the present technology can also have the following configurations.

(1)

A storage device comprising:
- a storage element and a reference element each having a fixed layer whose magnetization direction is fixed, a storage layer whose magnetization direction is changeable, and an insulating layer provided between the fixed layer and the storage layer;
- a base layer provided with the storage element and the reference element; and
- a semiconductor substrate having a surface on which the base layer is laminated, wherein
- the base layer has
- a first inclined surface inclined with respect to the surface, and
- a second inclined surface inclined with respect to the surface or a plane parallel to the surface at an inclination angle smaller than an inclination angle of the first inclined surface,
- the storage element is provided on the first inclined surface, and
- the reference element is provided on the plane or the second inclined surface.

(2)

The storage device according to (1), wherein
- the base layer has the plane and the second inclined surface, and
- a plurality of the reference elements are provided on the plane and the second inclined surface.

(3)

The storage device according to (1) or (2), wherein
- a resistance value of the reference element is identical to a resistance value of the storage element, and
- an area of a planar shape parallel to the plane of the reference element is larger than an area of a planar shape parallel to the first inclined surface of the storage element.

(4)

The storage device according to any one of (1) to (3), wherein
- a plurality of the storage elements are provided on the first inclined surface and the plane.

(5)

The storage device according to (4), wherein
- the plurality of storage elements are provided on the second inclined surface in addition to the first inclined surface and the plane.

(6)

The storage device according to any one of (1) to (5), wherein
- the base layer has a third inclined surface whose inclination direction with respect to the surface is different from the first inclined surface, and
- a plurality of the storage elements are provided on the first inclined surface and the third inclined surface.

(7)

The storage device according to (6), wherein
- the first inclined surface and the third inclined surface are two inclined surfaces in which a separation distance between the inclined surfaces gradually increases toward the surface.

(8)

The storage device according to (6) or (7), wherein
- the inclination angle of the first inclined surface and an inclination angle of the third inclined surface are identical.

(9)

The storage device according to (6) or (7), wherein
- the inclination angle of the first inclined surface and an inclination angle of the third inclined surface are different.

(10)

The storage device according to any one of (1) to (9), wherein
- the base layer includes a through wiring electrically connected to the reference element provided on the plane or the second inclined surface.

(11)

The storage device according to (10), wherein
- the plane or the second inclined surface includes an exposed surface on which the through wiring is exposed from the base layer, and the reference element electrically connected to the through wiring is provided in the exposed surface.

(12)

The storage device according to any one of (1) to (11), wherein the base layer includes a through wiring electrically connected to the storage element provided on the first inclined surface.

(13)

The storage device according to (12), wherein the first inclined surface includes an exposed surface on which the through wiring is exposed from the base layer, and the storage element electrically connected to the through wiring is provided in the exposed surface.

(14)

An electronic apparatus comprising a storage device that stores information, wherein the storage device includes:

a storage element and a reference element each having a fixed layer whose magnetization direction is fixed, a storage layer whose magnetization direction is changeable, and an insulating layer provided between the fixed layer and the storage layer;

a base layer provided with the storage element and the reference element; and a semiconductor substrate having a surface on which the base layer is laminated, the base layer has:

a first inclined surface inclined with respect to the surface; and a second inclined surface inclined with respect to the surface or a plane parallel to the surface at an inclination angle smaller than an inclination angle of the first inclined surface, the storage element is provided on the first inclined surface, and the reference element is provided on the plane or the second inclined surface.

(15)

A method for manufacturing a storage device, the method comprising:

forming, on a surface of a semiconductor substrate, a base layer having a first inclined surface inclined with respect to the surface and a second inclined surface inclined with respect to the surface or a plane parallel to the surface at an inclination angle smaller than an inclination angle of the first inclined surface; and forming, on the first inclined surface, a storage element having a fixed layer whose magnetization direction is fixed, a storage layer whose magnetization direction is changeable, and an insulating layer provided between the fixed layer and the storage layer, and forming, on the plane or the second inclined surface, a reference element having a fixed layer whose magnetization direction is fixed, a storage layer whose magnetization direction is changeable, and an insulating layer provided between the fixed layer and the storage layer.

(16)

An electronic apparatus including the storage device according to any one of (1) to (13).

(17)

A method for manufacturing a storage device of manufacturing the storage device according to any one of (1) to (13).

REFERENCE SIGNS LIST

1 STORAGE DEVICE
10 MTJ ELEMENT
20 SELECTION TRANSISTOR
30 INSULATING LAYER
32 LOWER INSULATING LAYER
34 UPPER INSULATING LAYER
40 PHOTOMASK
50 RESIST LAYER
70 BIT LINE
72 GATE ELECTRODE
74 WIRING
100 BASE LAYER
102 FIXED LAYER
104 INSULATING LAYER
106 STORAGE LAYER
108 CAP LAYER
200 SEMICONDUCTOR SUBSTRATE
200*a* SURFACE
202 SOURCE REGION
204 DRAIN REGION
206 ELEMENT ISOLATION LAYER
208 CONTACT LAYER
208*a* EXPOSED SURFACE
210 CONTACT LAYER
501 MEMORY CELL
501*a* STORAGE ELEMENT
501*b* SELECTION TRANSISTOR
502 REFERENCE CELL
502*a* REFERENCE ELEMENT
502*b* SELECTION TRANSISTOR
511 SENSE AMPLIFIER
512 SENSE AMPLIFIER
513 SENSE AMPLIFIER
M1 PLANE
M2 INCLINED SURFACE
M3 INCLINED SURFACE

The invention claimed is:

1. A storage device comprising:

a storage element and a reference element each having a fixed layer whose magnetization direction is fixed, a storage layer whose magnetization direction is changeable, and an insulating layer provided between the fixed layer and the storage layer;

a base layer provided with the storage element and the reference element; and a semiconductor substrate having a surface on which the base layer is laminated, wherein the base layer has a first inclined surface inclined with respect to the surface, and a second inclined surface inclined with respect to the surface or a plane parallel to the surface at an inclination angle smaller than an inclination angle of the first inclined surface, the storage element is provided on the first inclined surface, and the reference element is provided on the plane or the second inclined surface.

2. The storage device according to claim 1, wherein the base layer has the plane and the second inclined surface, and a plurality of the reference elements are provided on the plane and the second inclined surface.

3. The storage device according to claim 1, wherein a resistance value of the reference element is identical to a resistance value of the storage element, and an area of a planar shape parallel to the plane of the reference element is larger than an area of a planar shape parallel to the first inclined surface of the storage element.

4. The storage device according to claim 1, wherein a plurality of the storage elements are provided on the first inclined surface and the plane.

5. The storage device according to claim 4, wherein the plurality of storage elements are provided on the second inclined surface in addition to the first inclined surface and the plane.

6. The storage device according to claim 1, wherein the base layer has a third inclined surface whose inclination direction with respect to the surface is different from the first inclined surface, and a plurality of the storage elements are provided on the first inclined surface and the third inclined surface.

7. The storage device according to claim 6, wherein the first inclined surface and the third inclined surface are two inclined surfaces in which a separation distance between the inclined surfaces gradually increases toward the surface.

8. The storage device according to claim 6, wherein the inclination angle of the first inclined surface and an inclination angle of the third inclined surface are identical.

9. The storage device according to claim 6, wherein the inclination angle of the first inclined surface and an inclination angle of the third inclined surface are different.

10. The storage device according to claim 1, wherein the base layer includes a through wiring electrically connected to the reference element provided on the plane or the second inclined surface.

11. The storage device according to claim 10, wherein the plane or the second inclined surface includes an exposed surface on which the through wiring is exposed from the base layer, and the reference element electrically connected to the through wiring is provided in the exposed surface.

12. The storage device according to claim 1, wherein the base layer includes a through wiring electrically connected to the storage element provided on the first inclined surface.

13. The storage device according to claim 12, wherein the first inclined surface includes an exposed surface on which the through wiring is exposed from the base layer, and the storage element electrically connected to the through wiring is provided in the exposed surface.

14. An electronic apparatus comprising a storage device that stores information, wherein the storage device includes:

a storage element and a reference element each having a fixed layer whose magnetization direction is fixed, a storage layer whose magnetization direction is changeable, and an insulating layer provided between the fixed layer and the storage layer;

a base layer provided with the storage element and the reference element; and a semiconductor substrate having a surface on which the base layer is laminated, the base layer has:

a first inclined surface inclined with respect to the surface; and a second inclined surface inclined with respect to the surface or a plane parallel to the surface at an inclination angle smaller than an inclination angle of the first inclined surface, the storage element is provided on the first inclined surface, and the reference element is provided on the plane or the second inclined surface.

15. A method for manufacturing a storage device, the method comprising:

forming, on a surface of a semiconductor substrate, a base layer having a first inclined surface inclined with respect to the surface and a second inclined surface inclined with respect to the surface or a plane parallel to the surface at an inclination angle smaller than an inclination angle of the first inclined surface; and forming, on the first inclined surface, a storage element having a fixed layer whose magnetization direction is fixed, a storage layer whose magnetization direction is changeable, and an insulating layer provided between the fixed layer and the storage layer, and forming, on the plane or the second inclined surface, a reference element having a fixed layer whose magnetization direction is fixed, a storage layer whose magnetization direction is changeable, and an insulating layer provided between the fixed layer and the storage layer.

* * * * *